(12) United States Patent  (10) Patent No.: US 8,976,914 B2
Viswanathan  (45) Date of Patent: Mar. 10, 2015

(54) MULTI-TAP IQ IMBALANCE ESTIMATION AND CORRECTION CIRCUIT AND METHOD

(75) Inventor: Nagarajan Viswanathan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 237 days.

(21) Appl. No.: 13/560,020

(22) Filed: Jul. 27, 2012

(65) Prior Publication Data

US 2014/0029700 A1  Jan. 30, 2014

(51) Int. Cl.
    *H04L 1/00*    (2006.01)
(52) U.S. Cl.
    USPC ........... 375/350; 375/316; 375/324; 375/340; 375/346
(58) Field of Classification Search
    CPC ............ H04L 27/2601; H04L 27/3863; H04L 27/2647; H04L 27/2628; H04B 17/0015; H04B 1/71637
    USPC ........................ 375/350, 316, 324, 340, 346
    See application file for complete search history.

(56) References Cited

U.S. PATENT DOCUMENTS

| | | | |
|---|---|---|---|
| 5,872,538 A | 2/1999 | Fowler | |
| 6,330,290 B1 | 12/2001 | Glas | |
| 6,340,883 B1 | 1/2002 | Nara et al. | |
| 6,785,529 B2 | 8/2004 | Ciccarelli et al. | |
| 7,088,765 B1 * | 8/2006 | Green et al. | 375/142 |
| 7,177,372 B2 | 2/2007 | Gu | |
| 2004/0203472 A1 | 10/2004 | Chien | |
| 2005/0069050 A1 | 3/2005 | Ding et al. | |
| 2006/0203901 A1 * | 9/2006 | Tan et al. | 375/233 |
| 2008/0063113 A1 | 3/2008 | Gao et al. | |
| 2010/0008449 A1 * | 1/2010 | Sayers | 375/322 |
| 2010/0215125 A1 | 8/2010 | Furman | |
| 2011/0222638 A1 * | 9/2011 | Park et al. | 375/346 |
| 2011/0260898 A1 | 10/2011 | Velazquez | |

OTHER PUBLICATIONS

"I/Q signal Mismatch Theory", http://paul.wad.homepage.dk/iq_mismatch_theory/doc.html, pp. 1-2.

"Adaptive IQ Mismatch Cancellation for Quadrature IF Receivers", by Isis Mikhael et al., ISBN: 960-8457-09-02, 2005, pp. 1-6.

* cited by examiner

*Primary Examiner* — Leila Malek

(74) *Attorney, Agent, or Firm* — Alan A. R. Cooper; Frederick J. Telecky, Jr.

(57) ABSTRACT

A system for correcting gain imbalance and phase imbalance between first ($I_{OUT}$) and second ($Q_{OUT}$) signals which are 90° out of phase, including circuitry for estimating the phase mismatch ($\phi$) and gain mismatch ($\Delta$) between the first signal and the second signal signals in a plurality of frequency bands. An inverse fast Fourier transform is performed on each of a number of arrays of the phase mismatch estimates and the gain mismatch estimates to generate correction filter coefficients (h[N]) for a N tap correction filter. The N tap correction filter filters an uncorrected value of the second signal to generate a corrected value of the second signal.

17 Claims, 8 Drawing Sheets

US 8,976,914 B2

MULTI-TAP IQ IMBALANCE ESTIMATION AND CORRECTION CIRCUIT AND METHOD

BACKGROUND OF THE INVENTION

The present invention relates generally to correction, over a range of signal frequencies, of mismatch between in-phase "I" signals and quadrature-phase "Q" signals of an "IQ signal pair". More particularly, the invention relates to circuitry and a method for correcting arbitrary mismatches, i.e., "IQ mismatches", between an in-phase signal path or "I path" and a quadrature-phase signal path or "Q path" through which the IQ signal pair propagates.

IQ mismatch is the primary reason for the well-known infeasibility of building multicarrier radio receivers with zero IF (intermediate frequency). Zero IF receivers also are known as "direct conversion receivers". The known IQ mismatch correction algorithms do not function properly for frequency-dependent IQ mismatches. However, it would be very desirable to have a practical system capable of estimating and correcting for arbitrary mismatches between an I path and a Q path of an IQ signal pair, especially without use of a calibration signal as is required by some existing IQ mismatch correction algorithms, because it is infeasible to add calibration tones at multiple frequencies to determine the mismatch across the multiple frequencies.

IQ mismatch also is a concern in other systems that employ quadrature mixing such as superheterodyne receivers employing IQ techniques for image rejection. For example, IQ systems are used in digital pre-distortion systems for improving PA (power amplifier) linearity.

Referring to FIG. 1, a conventional zero IF receiver 1 includes a low noise amplifier (LNA) 2 which amplifies an RF input signal $RF_{IN}$ and applies the amplified result to the input of a saw filter 3. The output of saw filter 3 is applied to both one input of a mixer 5A and one input of a mixer 5B. The other input of mixer 5A is coupled to receive an in-phase signal generated on conductor 9A by a phase shifting circuit 9. The other input of mixer 5B is coupled to receive a quadrature-phase signal generated on conductor 9B by phase shifting circuit 9. A local oscillator 7 generates a signal that is applied to the input of a buffer 8, the output of which is applied to the input of phase shifter 9. The quadrature-phase signal generated on conductor 9B is shifted in phase by 90° with respect to the in-phase signal on conductor 9A.

The output of mixer 5A is applied to the input of an adjustable gain amplifier 10A, the output of which is applied to the input of a LPF (low pass filter) 11A. The output of LPF 11A is applied to the input of a buffer 12A, the output of which is applied by means of a conductor 13A to the input of an ADC 14A. The digital output $I_{OUT}$ of ADC 14A is generated on a bus 15A. Similarly, the output of mixer 5B is applied to the input of an amplifier 10B, the output of which is applied to the input of a LPF 11B. The output of LPF 11B is applied to the input of a buffer 12B, the output of which is applied by means of a conductor 13B to the input of an ADC 14B. The digital output $Q_{OUT}$ of ADC 14B is generated on a bus 15B. The signals $I_{OUT}$ and $Q_{OUT}$ constitute an IQ signal pair.

The signal path including mixer 5A, amplifier 10A, LPF 11A, buffer 12A, and ADC 14A is referred to as an "in-phase path" or "I path" because mixer 5A receives the in-phase signal 9A generated by phase shifter 9. The signal path including mixer 5B, amplifier 10B, LPF 11B, buffer 12B, and ADC 14B is referred to as a "quadrature-phase path" or "Q path" because mixer 5B receives a quadrature-phase signal (shifted by 90°) generated on conductor 9B by phase shifter 9.

The correction equations for an IQ signal pair are as follows:

$$Rf_{in}=A \cos[(\omega_c+\omega_m)t]+B\cos[(\omega_c-\omega_m)t], \quad \text{Eq. (1)}$$

where A is the message signal located at $\omega_c+\omega_m$ and B is the message signal located at $\omega_c-\omega_m$, as shown in the upper spectrum plot in FIG. 2. After being mixed with a local oscillator output signal centered at $\omega_c$, both of message signals A and B would be located at $\omega_m$, as shown in the spectrum plots of the in-phase signal $I_{OUT}$ and the quadrature-phase signal $Q_{OUT}$ in FIG. 2.

$$I_{OUT} = LPF(\cos(\omega_c t)(A\cos\{(\omega_c+\omega_m)\}+B\cos[(\omega_c-\omega_m)t]); \quad \text{Eq. (2)}$$

$$I_{ADC\_OUT} = \frac{A}{2}\cos(\omega_m nTs) + \frac{B}{2}\cos(\omega_m nTs), \quad \text{Eq. (3)}$$

$$Q_{OUT} = LPF(\sin(\omega_c t)(A\cos\{(\omega_c+\omega_m)\}+B\cos[(\omega_c-\omega_m)t], \quad \text{Eq. (4)}$$

and $$Q_{ADC\_OUT} = \frac{B}{2}\sin(\omega_m nTs) + \frac{A}{2}\sin(\omega_m nTs). \quad \text{Eq. (5)}$$

Message signals A and B can be separated as indicated in Equations 6 and 7, wherein the j operator imparts a phase shift of 90°.

$$I_{ADC\_OUT}+jQ_{ADC\_out}=A\cos(\omega_m nTs); \quad \text{Eq. (6)}$$

$$I_{ADC\_OUT}-jQ_{ADC\_OUT}=B\cos(\omega_m nTs). \quad \text{Eq. (7)}$$

FIG. 2 shows the spectrum of the RF input signal $RF_{IN}$, the demodulated in-phase signal $I_{OUT}$, and the demodulated quadrature-phase signal $Q_{OUT}$ shown in FIG. 1. In the input spectrum shown in FIG. 2, there are two signals, $\omega_c+\omega_m$ and $\omega_c-\omega_m$. $\omega_c$ is the frequency of the carrier signal of the input signal $RF_{IN}$. $\omega_m$ is the frequency of the modulation signal, which is the signal of interest. When two RF signals having a carrier frequency $\omega_c$ and a modulation frequency or signal frequency $\omega_m$, respectively, are multiplied or mixed, two signal components are generated, one of which has a frequency $\omega_c+\omega_m$, as shown in FIG. 2. The other signal component has a frequency $\omega_c-\omega_m$.

In the foregoing equations, the message signal or amplitude signal A corresponds to positive frequencies in the frequency domain spectrum of FIG. 2 and the signal B represents the negative frequencies therein. The mixing or demodulation of a positive frequency signal of magnitude A and a negative frequency signal of magnitude B appears in the frequency spectrum of the two signals on the horizontal axes in FIG. 2. The in-phase component of the positive frequency may be represented by the vector 27 in FIG. 3. The in-phase component $I_{OUT}$ appears along the x axis and the quadrature-phase component $Q_{OUT}$ appears along the y axis in the vector diagrams. It can be seen that the signal Iresultant has a positive frequency and that the quadrature component 26,27 is rotated 90° in the clockwise direction, and for a negative frequency signal the quadrature component 26,27 rotates 90° in the counterclockwise direction. In this case, only the positive frequencies are of interest. Therefore, the positive frequency signal A is of interest, and the negative frequency signal B is to be completely canceled. Rotating the Q vectors 26,27 counterclockwise by 90° is accomplished by performing a "jQ" operation, wherein the B portion 26 rotates counterclockwise to the left as a result of the I+jQ rotation and completely cancels out the B/2 portion of vector 25. At the same time, vector 27 also rotates counterclockwise and adds its value A/2 to the A/2 portion of vector 25 to form the resultant vector A=A/2+A/2.

The main components of IQ mismatch (i.e., mismatch between the in-phase and quadrature-phase paths of the IQ signal pair) include gain error mismatches between the ADCs, mixers, and amplifiers, phase deviation from 90° for the mixer in the Q path, mismatches in the pole frequencies of the LPFs (low pass filters), mismatches at the instants of time at which sampling occurs, and mismatches in the bandwidths of the ADCs. Such mismatches may cause generation of image tones. Mismatches in the instants of sampling and in the bandwidths of the two ADCs cause phase shift errors. For example, if the instant of sampling in the Q path is not exactly the same as the instant of the corresponding sampling in the I path, this causes a phase shift mismatch which may be problematic.

The most relevant prior art directed to correcting IQ mismatch is believed to include the following US patents. U.S. Pat. No. 6,330,290, entitled "Digital I/Q Imbalance Compensation", issued Dec. 11, 2001, discloses single tap estimation and correction of IQ mismatch using test tone generation. U.S. Pat. No. 6,785,529 entitled "System and Method for I-Q Mismatch Compensation in a Low IF or Zero IF Receiver", issued Aug. 31, 2004, discloses a correction scheme that applies a correction factor to at least one of the I and Q signals to correct for gain and/or phase errors. U.S. Pat. No. 5,872,538 entitled "Frequency Domain Correction of I/Q Imbalance" issued Feb. 16, 1999, discloses a technique based on use of a fast Fourier transform (FFT). U.S. Pat. No. 6,340,883 entitled "Wide Band IQ Splitting Apparatus and Calibration Method Therefor with Balanced Amplitude and Phase between I and Q", issued Jan. 22, 2002, discloses a general technique for providing a calibration tone at multiple frequencies.

U.S. Pat. No. 7,177,372 entitled "Method and Apparatus to Remove Effects of I-Q Imbalances of Quadrature Modulators and the Modulators in a Multi-Carrier System", issued Feb. 13, 2007, discloses splitting the input signal into individual signals and correction of IQ mismatch by adding portion of the image band into the band of interest. This reference is believed to be the closest prior art.

A known technique for single tap IQ mismatch estimation and correction is represented by the following equations:

$$I = A\cos(\omega_m nTs); \quad \text{Eq. (8)}$$

$$Q = A(1-\Delta)\sin(\omega_m nTs + \phi), \quad \text{Eq. (9)}$$

where $\Delta$ represents gain mismatch between the I and Q paths and $\phi$ represents phase mismatch between the I and Q paths. $\Delta$ and $\phi$ may be estimated using Equations 10 and 11:

$$\Sigma I^2 - \Sigma Q^2 = A^2 \Delta; \quad \text{Eq. (10)}$$

$$\Sigma IQ = A^2 \sin(\phi). \quad \text{Eq. (11)}$$

Based on Equations 8-11, it can be shown that $$Q\text{out}(DC\text{corrected}) = (1\Delta)Q + \beta I. \quad \text{Eq. (12)}$$

where $\Delta$ and $\phi$ are assumed to be constant over the entire band of interest. Correction of the IQ mismatch using Equation 12 at a single frequency is referred to as "single tap correction". In Equation 12 the gain mismatch estimate $\Delta$ corrects for gain mismatch, and the phase mismatch estimate $\phi$ corrects for the phase mismatch.

Equation 12 indicates a conventional way for single-tap imbalance estimation and correction algorithm circuit 32 to achieve single tap estimation and correction of the gain term of the IQ mismatch if $\Delta$ and $\phi$ are constant over the frequency band of interest. To correct for the gain mismatch in Equation 12, the signal $Q_{OUT}$ is multiplied by a fraction $(1+\Delta)$, and the term $\beta$ of the term $\beta I$ is adjusted so as to make $\Delta$ equal to zero. That is, the gain $\Delta$ of the Q path is increased or decreased slightly so as to correct a mismatch in the Q path.

The vector or phasor analysis previously indicated in FIG. 3 indicates the conventional way for single-tap imbalance estimation and correction algorithm circuit 32 to correct for the phase mismatch $\phi$. For the circuit condition represented by the vectors in FIG. 3, the I path and the Q path signals should be exactly 90° out of phase, and in effect, the vectors indicated are rotated so as to bring the I path signal and the Q path signal back to being exactly 90° out of phase.

FIG. 4A illustrates an implementation of a conventional single-tap IQ imbalance estimation and correction system which is a common single-tap prior art system that does not included any frequency dependent estimation/correction, pictorially illustrates a basic way of implementing Equation 12. $\beta$ is an estimate of the phase mismatch, and $\Delta$ is an estimate of the gain mismatch. Blocks 21-1 and 21-6 represent the sources of the in-phase signal I and the quadrature-phase signal I, respectively. To obtain a value of the phase mismatch estimate $\phi$, a summation $\Sigma IQ$ is performed in block 21-2, using Equation 11. $\beta$ is multiplied by I in block 21-4 and then is added in block 21-7 to Q. The value of $\Delta$ is obtained from Equation 10, using blocks 21-11 and 21-10 to obtain $A^2$. Blocks 21-3, 21-9, and 21-11 generate $\Sigma I^2 - \Sigma Q^2$ of equation 10, and that quantity needs to be divided by $A^2$ to obtain $\Delta$. Block 21-10 performs that division to generate $\Delta$, which then is multiplied by Q, aunt block 21-8 generates the corrected quadrature-phase signal on conductor 15B.

The main drawback of a single tap correction is the inability to estimate and correct frequency dependent mismatches. Mismatches in the low pass filters in the in-phase path and the quadrature-phase path result in frequency dependent gain and delay mismatches. A single tap correction will fail to correct such mismatches.

Well known "multi-tap correction" techniques have been utilized for correcting mismatches of phase and amplitude that are variable across a frequency range of interest. The prior multi-tap correction technique splits the input spectrum into multiple channels and corrects each channel (but does not combine the split and corrected spectrum to provide the original full spectrum as described herein later). The known multi-tap correction techniques are not feasible when the channel count in a spectrum is large.

Difficulties associated with IQ mismatch are a primary reason for the infeasibility of building multicarrier radio receivers with zero IF (i.e., zero intermediate frequency). The existing mismatch correction algorithms do not work with frequency-dependent IQ mismatch.

Thus, there is an unmet need for a practical system and technique for determining the IQ gain mismatch and phase mismatch that vary significantly across a frequency range of interest.

There also is an unmet need for a practical way of determining the relation between the IQ gain and phase mismatches and filter coefficients h[N] at each frequency.

SUMMARY OF THE INVENTION

It is an object of the invention to provide a practical system and technique for determining the IQ gain mismatch and phase mismatch that vary significantly across a frequency range of interest.

It is another object of the invention to provide a practical way of determining the relation between the IQ gain and phase mismatches and filter coefficients h[N] at each frequency.

It is another object of the invention to provide a practical system and technique for distinguishing between phase mismatch and group delay mismatch between the I and Q paths of an IQ system.

It is another object of the invention to provide a practical system and technique for correcting phase mismatch and group delay mismatch independently.

Briefly described, and in accordance with one embodiment, the present invention provides a system (55-1) for correcting gain imbalance and phase imbalance between first ($I_{OUT}$) and second ($Q_{OUT}$) signals which are 90° out of phase, including circuitry (32) for estimating the phase mismatch ($\phi$) and gain mismatch ($\Delta$) between the first signal and the second signal signals in a plurality of frequency bands. An inverse fast Fourier transform is performed on each of a number of arrays of the phase mismatch estimates and the gain mismatch estimates to generate correction filter coefficients (h[N]) for a N tap correction filter (61). The N tap correction filter filters an uncorrected value of the second signal to generate a corrected value of the second signal.

In one embodiment, the invention provides a system (55-1) for correcting gain imbalance and phase imbalance between first ($I_{OUT}$) and second ($Q_{OUT}$) signals which are 90° out of phase, including circuitry (32) for estimating the phase mismatch ($\phi$) and gain mismatch ($\Delta$) between the first signal ($I_{OUT}$) and the second signal ($Q_{OUT}$) signals in a plurality of frequency bands. Circuitry (60) performs an inverse fast Fourier transform (IFFT) on each of a number of arrays of the phase mismatch estimates ($\phi$) and the gain mismatch estimates ($\Delta$) to generate correction filter coefficients (h[N]) for a N tap correction filter (61). The N tap correction filter (61) filters an uncorrected value of the second signal ($Q_{OUT}$) to generate a corrected value of the second signal ($Q_{OUT}$).

In one embodiment, the estimating circuitry (32) performs a function of distinguishing filter delay mismatches and mixer phase mismatches of the first signal ($I_{OUT}$) and the second signal ($Q_{OUT}$) signals at the plurality of frequency bands.

In one embodiment, circuitry (40) splits each of the first ($I_{OUT}$) and ($Q_{OUT}$) signals into a predetermined number (N) of frequency bands to provide a plurality of in-phase and quadrature-phase signals in the frequency bands, respectively. Circuitry (58) successively produces a phase mismatch estimate ($\phi$) and a gain mismatch estimate ($\Delta$) corresponding to the successive frequency bands (k=0, 1 ... N), respectively, on the basis of samples ($I_{kc}$, $Q_{kc}$, $I_{ks}$, $Q_{ks}$) of the in-phase and quadrature-phase signals in the frequency bands. In a described embodiment, the splitting circuitry (40) includes a bank (40) of filters for splitting each of the first ($I_{OUT}$) and ($Q_{OUT}$) signals into the predetermined number (N) of frequency bands. The estimating circuitry (58) operates to successively produce a plurality of pairs of mismatch estimates corresponding to the plurality of successive frequency bands (k=0, 1 . . . N), respectively, on the basis of samples of in-phase and quadrature-phase signal values ($I_{kc}$, $Q_{kc}$, $I_{ks}$, $Q_{ks}$) generated by the bank (40) of filters, each pair including a phase mismatch estimate ($\phi$) and a gain mismatch estimate ($\Delta$). The inverse fast Fourier transform performing circuitry (60) performs an inverse fast Fourier transform (IFFT) on each of a number of arrays (Hr[k],Hi[k]) of the phase mismatch estimates ($\phi$) and gain mismatch estimates ($\Delta$) to generate filter coefficients (h[N]) for an N tap filter (61) for filtering an uncorrected value of the second signal ($Q_{OUT}$) to generate a corrected value of the second signal ($Q_{OUT}$).

In one embodiment, a DC phase correction circuit (59-1, 65,68) includes a mixer (65) for mixing the first signal ($I_{OUT}$) with a DC mismatch adjustment value (Pc[0]) and an adder (68) for adding an output of the mixer (65) to the second signal ($Q_{OUT}$) to generate the uncorrected value of the second signal ($Q_{OUT}$) such that the N tap filter (61) essentially eliminates the gain imbalance and the phase imbalance between the first ($I_{OUT}$) and second ($Q_{OUT}$) signals across all of the (N) frequency bands.

In one embodiment, the phase mismatch estimates ($\phi$) are determined in accordance with the equation $$\sin(\varphi) = \frac{I_{kc}Q_{kc} + I_{ks}Q_{ks}}{Q_{ks}^2 + Q_{kc}^2},$$

where $\phi$ is a phase mismatch estimate, $I_{kc}$ is a cosine-related in-phase signal in a predetermined frequency band produced by the bank (40) of filters, $Q_{kc}$ is a cosine-related quadrature signal in the predetermined frequency band produced by the bank (40) of filters, $I_{ks}$ is a sine-related in-phase signal in a predetermined frequency band produced by the bank (40) of filters, and $Q_{ks}$ is a sine-related quadrature signal in the predetermined frequency band produced by the bank (40) of filters.

In one embodiment, the gain mismatch estimates ($\Delta$) are determined in accordance with equation $$2\Delta = \frac{\sum I_{ks}^2 - \sum Q_{ks}^2 + \sum I_{kc}^2 - \sum Q_{kc}^2}{\sum (Q_{ks}^2 + Q_{kc}^2)},$$

where $\Delta$ is a gain mismatch estimate, $I_{kc}$ is a cosine-related in-phase signal in a predetermined frequency band produced by the bank (40) of filters, $Q_{kc}$ is a cosine-related quadrature signal in the predetermined frequency band produced by the bank (40) of filters, $I_{ks}$ is a sine-related in-phase signal in the predetermined frequency band produced by the bank (40) of filters, and $Q_{ks}$ is a sine-related quadrature signal in the predetermined frequency band produced by the bank (40) of filters.

In one embodiment, the N tap filter (61) includes a finite impulse response filter (FIR).

In one embodiment, the arrays (Hr[k],Hi[k]) of the phase mismatch estimates ($\phi$) and gain mismatch estimates ($\Delta$) represent a mismatch estimate frequency response of an IQ system through which the first ($I_{OUT}$) and second ($Q_{OUT}$) signals pass.

In one embodiment, the bank (40) of filters includes a plurality of mixing and filtering circuits (35,36,37) for mixing the first signal ($I_{OUT}$) with a plurality of first reference signals (DC,Fc,KFc) and for mixing the second signal ($Q_{OUT}$) with a plurality of second reference signals which are shifted 90° relative to a corresponding first reference signal, respectively, and also includes low pass filtering outputs of the various mixed signals to provide the samples of the in-phase and quadrature-phase signal values ($I_{kc}$, $Q_{kc}$, $I_{ks}$, $Q_{ks}$) generated by the bank (40) of filters.

In one embodiment, the arrays ($H_r[k]$, $H_i[k]$) are included in a primary feedback loop also including the bank of filters (40), the estimating circuitry (58), and the fast Fourier transform performing circuitry (60), and the DC mismatch adjustment value ($H_r[0]$,Pc[0]) is provided as an input to a secondary feedback loop including the mixer (65) for mixing the first signal ($I_{OUT}$) with the DC mismatch adjustment value (Pc[0]) and the adder (68) to generate the uncorrected value of the second signal ($Q_{OUT}$).

In one embodiment, the primary and secondary loops are independent.

In one embodiment, the first signal ($I_{OUT}$) is an in-phase signal and the second signal ($Q_{OUT}$) is a quadrature-phase signal.

In one embodiment, the invention provides a method for correcting gain imbalance and phase imbalance between first ($I_{OUT}$) and second ($Q_{OUT}$) signals which are 90° out of phase, the method including estimating the phase mismatch ($\phi$) and gain mismatch ($\Delta$) between the first signal ($I_{OUT}$) and the second signal ($Q_{OUT}$) signals in a plurality of frequency bands; performing an inverse fast Fourier transform (IFFT) on each of a number of arrays of the phase mismatch estimates ($\phi$) and a gain mismatch estimates ($\Delta$) to generate filter coefficients (h[N]) for an N tap correction filter (61); and filtering an uncorrected value of the second signal ($Q_{OUT}$) by means of the an N tap correction filter (61) to generate a corrected value of the second signal ($Q_{OUT}$).

In one embodiment, the method includes distinguishing filter delay mismatch components and mixer phase input mismatch components of the first signal ($I_{OUT}$) and the second signal ($Q_{OUT}$) signals in the multiple bands of frequencies and using the filter delay mismatch components and mixer phase input mismatch components separately to determine the phase mismatch estimates ($\phi$) and the gain mismatch estimates ($\Delta$).

In one embodiment, the method includes providing each of the first ($I_{OUT}$) and ($Q_{OUT}$) signals in a predetermined number (N) of frequency bands to provide a plurality of in-phase and quadrature-phase signals in the frequency bands, respectively, and successively producing a phase mismatch estimate ($\phi$) and a gain mismatch estimate ($\Delta$) corresponding to the successive frequency bands (k=0, 1 . . . N), respectively, on the basis of samples ($I_{kc}$, $Q_{kc}$, $I_{ks}$, $Q_{ks}$) of the in-phase and quadrature-phase signals in the frequency bands.

In one embodiment, the method includes generating a DC mismatch adjustment value (Pc[0]) on the basis of a phase mismatch estimate ($\phi$) at zero frequency, mixing the first signal ($I_{OUT}$) with the DC mismatch adjustment value (Pc[0]) and an adder (68), and adding an output of a mixer (65) to the second signal ($Q_{OUT}$) to generate a value of the second signal ($Q_{OUT}$) such that the N tap filter (61) essentially eliminates the gain imbalance and the phase imbalance between the first ($I_{OUT}$) and ($Q_{OUT}$) signals at DC and across all of the (N) frequency bands.

In one embodiment, the method includes determining the phase mismatch estimates ($\phi$) in accordance with the equation $$\sin(\varphi) = \frac{I_{kc}Q_{kc} + I_{ks}Q_{ks}}{Q_{ks}^2 + Q_{kc}^2},$$

and determining the gain mismatch estimates ($\Delta$) in accordance with equation $$2\Delta = \frac{\sum I_{ks}^2 - \sum Q_{ks}^2 + \sum I_{kc}^2 - \sum Q_{kc}^2}{\sum (Q_{ks}^2 + Q_{kc}^2)},$$

where $\phi$ is a phase mismatch estimate, $\Delta$ is a gain mismatch estimate, $I_{kc}$ is a cosine-related in-phase signal in a predetermined frequency band, $Q_{kc}$ is a cosine-related quadrature signal in the predetermined frequency band, $I_{ks}$ is a sine-related in-phase signal in the predetermined frequency band, and $Q_{ks}$ is a sine-related quadrature signal in the predetermined frequency band.

In one embodiment, the estimating includes computing the gain mismatch and the phase mismatch using discrete Fourier transforms in accordance with the equations $$Xi\_real(k) = \sum_{n=0}^{N-1} I(n)\cos\left(\frac{2\pi nk}{N}\right),$$

$$Xi\_imag(k) = \sum_{n=0}^{N-1} I(n)\sin\left(\frac{2\pi nk}{N}\right),$$

$$Xq\_real(k) = \sum_{n=0}^{N-1} Q(n)\cos\left(\frac{2\pi nk}{N}\right),$$

$$Xq\_imag(k) = \sum_{n=0}^{N-1} Q(n)\sin\left(\frac{2\pi nk}{N}\right),$$

$$GainMismatch = \frac{\sqrt{E(Xi\_real^2 + Xi\_imag^2 - Xq\_real^2 + Xq\_imag^2)}}{\sqrt{E(Xi\_real^2 + Xi\_imag^2)}},$$

and $$PhaseMismatch = E(Iphase - Qphase - 90\ deg)$$
$$= E\left(\tan^{-1}\left(\frac{Xi\_imag}{Xi\_real}\right)\right) - E\left(\tan^{-1}\left(\frac{Xq\_imag}{Xq\_real}\right)\right),$$

where E represents an averaging operation, k varies from 0 to N, N represents the number of points in an IFFT, and n represents the sample number.

In one embodiment, the invention provides a system for correcting gain imbalance and phase imbalance between first ($I_{OUT}$) and second ($Q_{OUT}$) signals which are 90° out of phase, including means (32) for estimating the phase mismatch ($\phi$) and gain mismatch ($\Delta$) between the first signal ($I_{OUT}$) and the second signal ($Q_{OUT}$) signals in a plurality of frequency bands; means (60) for performing an inverse fast Fourier transform (IFFT) on each of a number of arrays of the phase mismatch estimates ($\phi$) and a gain mismatch estimates ($\Delta$) to generate filter coefficients (h[N]) for an N tap correction filter (61); and wherein the N tap correction filter (61) filters an uncorrected value of the second signal ($Q_{OUT}$) to generate a corrected value of the second signal ($Q_{OUT}$).

In one embodiment, the system includes means (40) for providing each of the first ($I_{OUT}$) and ($Q_{OUT}$) signals in a predetermined number (N) frequency bands to provide a plurality of in-phase and quadrature-phase signals in the frequency bands, respectively, and means (58) for successively producing a phase mismatch estimate ($\phi$) and a gain mismatch estimate ($\Delta$) corresponding to the successive frequency bands (k=0, 1 . . . N), respectively, on the basis of samples ($I_{kc}$, $Q_{kc}$, $I_{ks}$, $Q_{ks}$) of the in-phase and quadrature-phase signals in the frequency bands.

In one embodiment, the system includes means (58) for distinguishing filter delay mismatch components and mixer phase mismatch components of the first signal ($I_{OUT}$) and the second signal ($Q_{OUT}$) signals in the multiple bands of frequencies.

DETAILED DESCRIPTION OF THE PREFERRED EMBODIMENTS

Multi-tap IQ imbalance estimation and correction systems are described which estimate and corrects for arbitrary phase and gain mismatches between an in-phase signal and a quadrature-phase signal of an IQ signal pair across a frequency range of interest. In one embodiment, the estimation and correction of IQ mismatch/imbalance is accomplished using a single filter bank and without use of a calibration signal. In another embodiment, the estimation and correction of IQ mismatch/imbalance is accomplished by using DFT (discrete Fourier transform)/FFT (fast Fourier transform) techniques. (Note that for the described embodiments of the invention, DFT and FFT techniques can be considered to be equivalent.) In another embodiment, delay mismatches in the LPF's of a receiver are distinguished from phase mismatches in the mixer inputs to develop estimates of phase mismatch and gain mismatch. In both embodiments, correction filter coefficients are obtained from mismatch values using inverse FFT techniques.

Figure 4A:
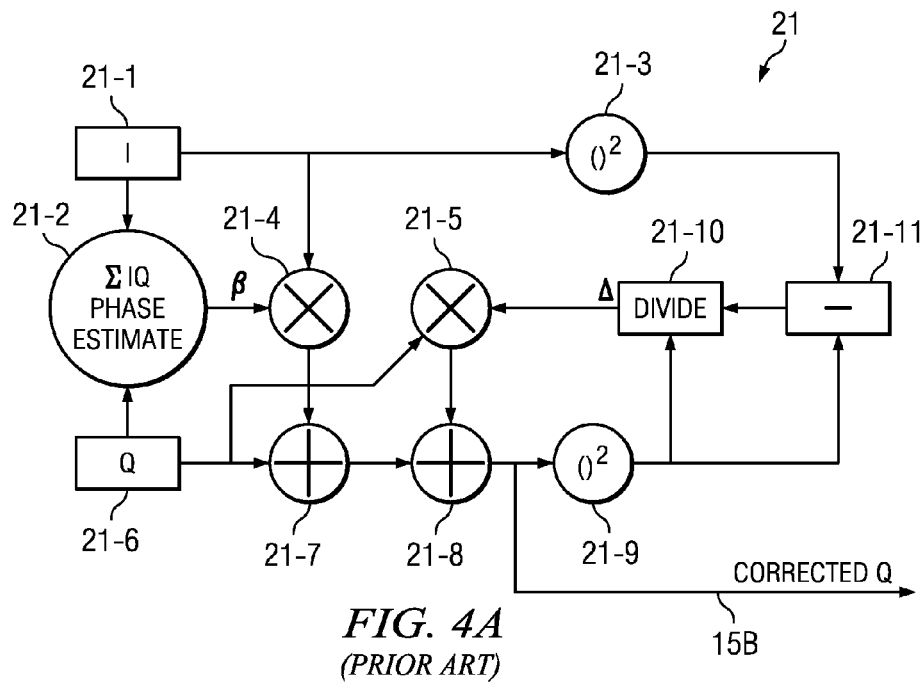
FIG. 4A is a block diagram of a conventional IQ imbalance estimation and correction system.
Figure 4B:
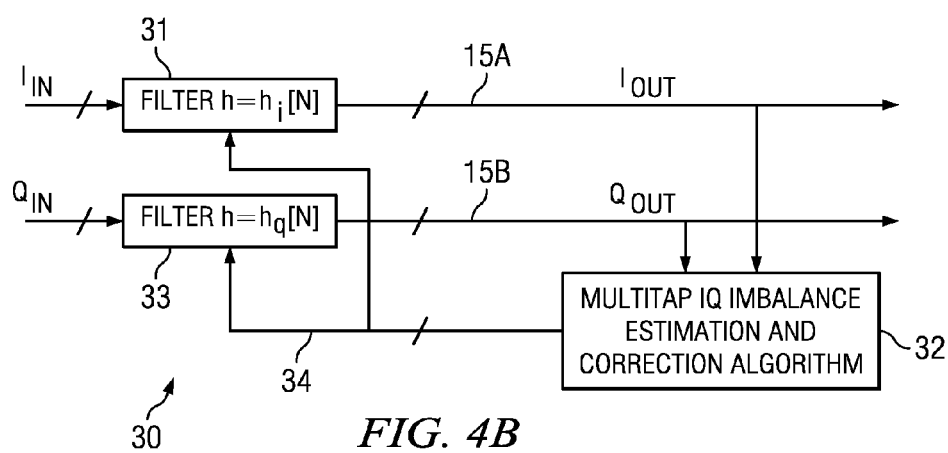
FIG. 4B is a block diagram of a multi-tap IQ imbalance estimation and correction system of the present invention.

Referring to FIG. 4B, multi-tap IQ imbalance estimation and correction system 30 includes an in-phase path filter ("I-path filter") 31 which receives and filters the digital in-phase signal $I_{IN}$ and produces the in-phase output signal $I_{OUT}$. I-path filter 31 operates in accordance with an array of filter coefficients represented by $h=h_i[N]$ and in accordance with feedback on bus 34 from multi-tap IQ imbalance estimation and correction algorithm circuit 32. Similarly, multi-tap IQ imbalance estimation and correction system 30 includes a quadrature-phase path filter ("Q-path filter") 33 which receives and filters digital in-phase signal $Q_{IN}$ and produces in-phase output signal $Q_{OUT}$. Q-path filter 33 operates in accordance with an array of filter coefficients represented by $h=h_q[N]$ and in accordance with feedback on bus 34 from a multi-tap IQ imbalance estimation and correction algorithm processor circuit 32, which may be a DSP (digital signal processor) or the like.

The multi-tap IQ estimation and correction algorithm executed by algorithm processing circuit 32 is utilized to provide correction of the coefficients $h=h_i[N]$ and $h=h_q[N]$ of I-path filter 31 and Q-path filter 33, respectively. The digital filter coefficients $h=h_i[N]$ and $h=h_q[N]$ are obtained by performing an IFFT (inverse FFT), wherein n represents the number of samples in the IFFT.

The multi-tap IQ mismatch estimation and correction algorithm performed in circuit 32 estimates and corrects arbitrary mismatches between the in-phase I-path and the quadrature-phase Q-path without use of a calibration signal or tone, by processing the IQ signal pair passed through a filter bank shown in subsequently described FIG. 5A. The multi-tap mismatch estimation and correction algorithm performed by circuit 32 then independently estimates the phase mismatch $\phi_f$ and the gain mismatch $\Delta_f$ for the I-path and Q-path, at a frequency "f" within each band of interest. The estimation and correction algorithm then estimates each of the filter coefficients h[N] to be used for a single FIR (finite impulse response) filter that corrects for the IQ imbalances or mismatches for each frequency band of interest.

Figure 5A:
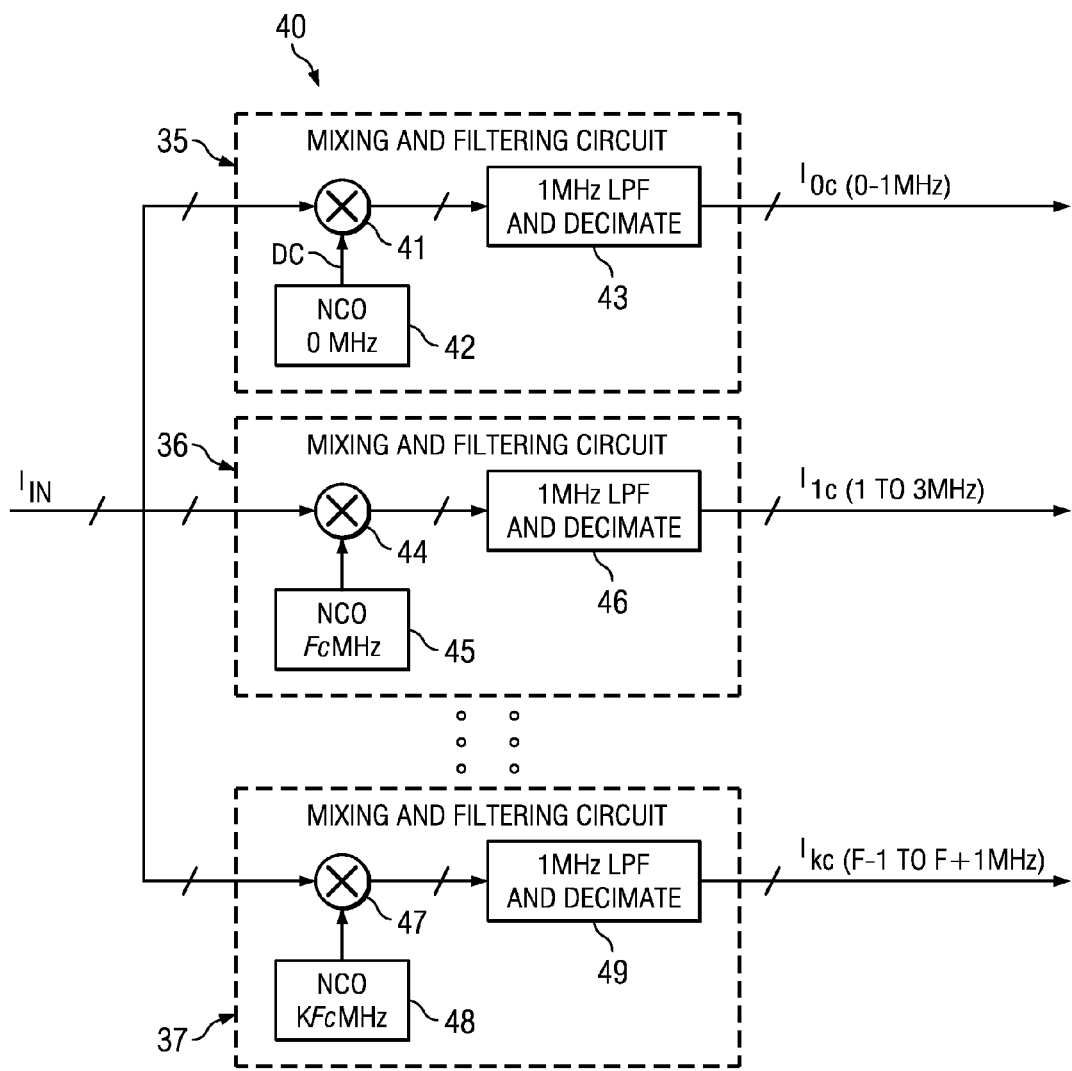
FIG. 5A is a block diagram of a filter bank used in accordance with the present invention.

Referring to FIG. 5A, filter bank 40 includes a number of mixing and filtering circuits, such as circuits 36, 37, and 38, for splitting the digital in-phase signal $I_{IN}$ into separate frequency bands of interest. The first mixing and filtering circuit includes a digital mixer that has one input coupled to $I_{IN}$, and another input generated by a NCO (numerically controlled oscillator). In block 35, NCO 42 is operated to provide a DC output to mixer 41. The output of mixer 41 is provided as an input to a 1 MHZ low pass filter and decimation circuit 43 which produces a digital output signal $I_{0c}$ having a frequency in the range from 0-1 MHZ. The second mixing and filtering circuit 36 shown in FIG. 5A includes a digital mixer 44 having one input that receives $I_{IN}$ and another input that receives the output of a NCO 45 having a frequency Fc MHZ. The output of mixer 44 is provided as an input to a 1 MHZ low pass filter and decimation circuit 46, which produces a digital output signal $I_{1c}$ having a frequency in the range from 1-3 MHZ. Similarly, the $K^{th}$ filtering circuit 37 of filter bank 40 includes a digital mixer 47 that has one input coupled to $I_{IN}$ and another input that receives the output of a NCO 48 having a frequency K×Fc MHZ. There are N such filtering circuits having spectrums centered at frequencies of 0, Fc, 2Fc, ..., NFc, respectively, where K is any number between 0 and N. The output of mixer 47 is provided as an input to a 1 MHZ low pass filter and decimation circuit 49, which produces a digital output signal $I_{kc}$ having a frequency in the range from (F−1) MHZ to (F+1) MHZ, where F=(ADC frequency)/N. The $K^{th}$ low pass filter and decimation circuit would produce signals having a spectrum centered at K×Fc±1 MHz. The foregoing low pass and decimation circuits 43, 46, and 49 may be substantially identical except that they pass different frequency ranges.

The I and Q signals of the input spectrum are separately passed through the bank 40 of filters in FIG. 5A. Note that a second filter bank (not shown) identical to filter bank 40 in FIG. 5A is used to similarly split $Q_{IN}$ into separate frequency bands of interest and generate the signal values $Q_{0m}$, $Q_{1m}$, and $Q_{km}$, etc. Also note that each of sections 35, 36, 37, etc. in FIG. 5A actually includes a second mixer which receives a second local oscillator signal that is 90° out-of-phase with the first local oscillator signal and also includes a second LPF and decimate circuit which filters the output of the second mixer, as shown in FIG. 5B.

Figure 5B:
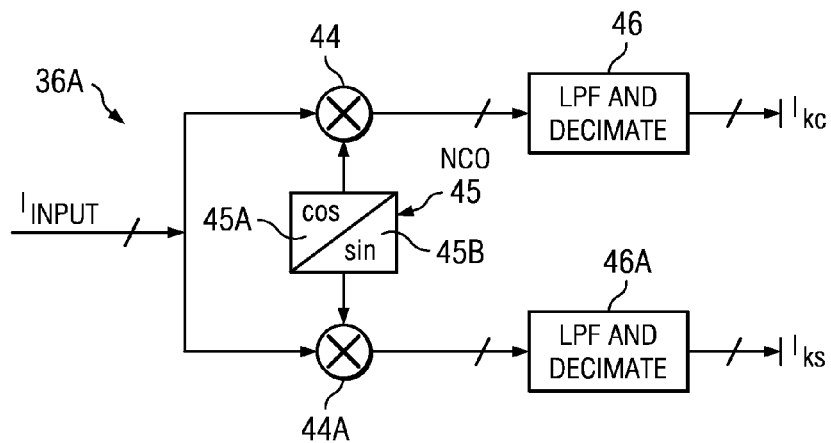
FIG. 5B is a block diagram which more completely represents each of the various sections 35, 36, and 37 of FIG. 5A.

Specifically, mixing and filtering circuit 36A in FIG. 5B indicates how each of mixing and filtering circuits 35, 36, and 37 of FIG. 5A may be implemented. Mixing and filtering circuit 36A includes mixer 44 and LPF and decimate circuit

46 as in FIG. 5A to generate a digital output signal $I_{kc}$ for the $k^{th}$ band. Mixing and filtering circuit 36A also includes a second mixer 44A which receives $I_{IN}$ and a second signal produced by NCO 45 which is exactly 90° out of phase with the signal provided to mixer 44. Mixer 44A generates a digital input to a second LPF and decimate circuit 46A, which generates a second digital output signal $I_{ks}$ for the $k^{th}$ band. NCO 45 includes a first section 45A which generates the "cosine" local oscillator output signal to mixer 44, and also includes a 90° phase shifting circuit 45B which generates the "sine" local oscillator output signal to mixer 44A. Equations 15 and 18 show the outputs $I_{kc}$ and $I_{ks}$, wherein the term "LPF" in Equations 15 and 18 means that whatever is inside the brackets/parentheses is part of the low pass filter. Similarly, Equations 16 and 19 show the outputs $Q_{kc}$ and $Q_{ks}$.

Each of the filters in bank 40 is used to obtain a separate gain mismatch value $\Delta_f$, a separate phase mismatch term $\sin(\phi_f)$, an in-phase signal $I_f$, and a separate quadrature-phase signal $Q_f$, each at a particular frequency "f" that lies in a corresponding frequency range or band of interest. N represents the number of frequency bands of interest generated by filter bank 40 in FIG. 5A. Equations 13 and 14 below are used to derive the expressions used in the estimation portion of the estimation and correction algorithm executed in block 32 of FIG. 4B.

$$\frac{\sum I_f^2 - Q_f^2}{A^2 N} = \Delta_f; \qquad \text{Eq. (13)}$$

$$\frac{\sum I_f - Q_f}{A^2 N} = \sin(\varphi_f). \qquad \text{Eq. (14)}$$

Equation 13 provides the estimated gain mismatch or imbalance $\Delta_f$ between the I path and the Q path, at the frequency "f". Similarly, Equation 14 provides the estimated phase mismatch $\phi_f$ at the particular frequency f. Use of the multiple filters in filter bank 40 therefore provides estimates of the gain mismatch $\Delta_f$ and phase mismatch $\phi_f$ across a desired range of individual frequencies in multiple frequency bands or ranges of interest. Each $I_f$ and $Q_f$ represents a corresponding frequency range/band within which a particular representative frequency "f" lies, where f is equal to kFc, and $I_f$ and $Q_f$ are the outputs of $K^{th}$ filter bank and each has bandwidth of $KFc \pm 1$ MHZ.

The number N of frequency bands required depends on the amount of IQ mismatch between the I signal and the Q signal of the IQ signal pair. For example, an amount of IQ mismatch which causes a larger number of cross frequencies to be generated requires a larger number of frequency bands to be generated by filter bank 40 of FIG. 5A. However, if the amount of IQ mismatch across the range of frequencies of interest is fairly constant, filter bank 40 may require a relatively low number (for example, only 4 or 8) of mixing and filtering circuits.

Filter bank 40 of FIG. 5A may be optimized to reduce the amount of integrated circuit area consistent with the required operating speed of the system in which the IQ signal pair is utilized. The input signal $I_{IN}$ is mixed with the outputs of the various mixers 41, 45, etc. I unchanged by the first mixer 41, and the output $I_{0c}$ of the filter and decimate circuit 43 contains signal frequencies from 0 to 1 MHZ. Similarly, the second band generated by mixing and filtering circuit 36 contains signal components of frequencies from 1 to 3 MHZ which are centered at a center frequency $f_c$, and the other signal frequencies of the output of mixer 44 are filtered out by filter and decimate circuit 43. The remaining mixing and filtering circuits generate separate similar output signals in separate bands of the input spectrum in generally the same way.

Equations 15-26 below show the derivation of the IQ phase mismatch estimate $\phi$ over a predetermined range of N frequency bands into which $I_{IN}$ has been split by filter bank 40 of FIG. 5A.

$$I_{kc} = LPF(A\cos(k\omega_c + \omega_m)nTs \cdot \cos(k\omega_c nTs + \theta)) \qquad \text{Eq. (15)}$$
$$= \frac{A}{2}\cos(\omega_m nTs - \theta);$$

and $$Q_{kc} = LPF(A\sin(k\omega_c + \omega_m + \varphi)nTs \cdot \cos(k\omega_c nTs + \theta)) \qquad \text{Eq. (16)}$$
$$= \frac{A}{2}\sin(\omega_m nTs + \varphi - \theta);$$

$$I_{kc}Q_{kc} = \sum \frac{A^2}{4}\cos(\omega_m nTs - \theta) \cdot \sin(\omega_m nTs + \varphi - \theta) \qquad \text{Eq. (17)}$$
$$= \frac{A^2}{8}\sum \sin(2\omega_m nTs - 2\theta + \varphi) + \frac{A^2}{8}\sum \sin(\varphi),$$

where $I_{kc}$ and $Q_{kc}$ are signals generated by filter bank 40, Ts is the sampling period, n is the number of samples, $\phi$ is the phase mismatch, and $\theta$ may be any arbitrary phase. Note that the number n of samples is different than and unrelated to the number N of filters in filter bank 40. Also note that conventional analog signal sampling is performed at the ADC inputs.

In order to estimate the phase mismatch $\phi$ for a particular frequency band, the outputs of the corresponding LPFs are used. There two LPF output signals for each band, one in response to $I_{IN}$ and the other in response to $Q_{IN}$. There are both an in-phase mixer and a quadrature-phase mixer, an in-phase NCO and a quadrature-phase NCO, and an in-phase LPF and a quadrature-phase LPF in each of mixer/filter circuits 35, 36, and 37. The second term $(A^2/8) \times \sin(\phi)$ in Equation 17 is the component of interest because the term $\sin(\phi)$ therein represents the IQ signal pair phase mismatch. The first term of Equation 17 should converge to zero, but this will occur only if the modulation frequency $\omega_m$ of $I_{IN}$ is zero or close to zero. The term $(A^2/8)\Sigma \sin(\phi)$ of Equation 17 can be used to conveniently determine the estimated phase mismatch $\phi$ only if the first term in Equation 17 does converge to zero.

When $\omega_m$ is zero, the first term in Equation 17 does not converge to zero. Equations 18-20 below are similar to Equations 15-17 and show further steps in the derivation of phase mismatch estimate equation 26, which holds even when $\omega_m$ is equal to zero.

$$I_{ks} = LPF(A\cos(k\omega_c + \omega_m)nTs \cdot \sin(k\omega_c nTs + \theta)) \qquad \text{Eq. (18)}$$
$$= \frac{A}{2}\cos(\omega_m nTs - \theta);$$

$$Q_{ks} = LPF(A\sin(k\omega_c + \omega_m + \varphi)nTs \cdot \sin(k\omega_c nTs + \theta)) \qquad \text{Eq. (19)}$$
$$= \frac{A}{2}\cos(\omega_m nTs + \varphi - \theta);$$

and $$I_{ks}Q_{ks} = -\sum \frac{A^2}{4}\sin(\omega_m nTs - \theta) \cdot \cos(\omega_m nTs + \varphi - \theta) \qquad \text{Eq. (20)}$$
$$= -\frac{A^2}{8}\sum \sin(2\omega_m nTs - 2\theta + \varphi) + \frac{A^2}{8}\sum \sin(\varphi),$$

where $I_{ks}$ and $Q_{ks}$ are signals generated by filter bank 40, Ts is the sampling period, n is the number of samples, φ is the phase mismatch, and θ may be any arbitrary phase.

$$I_{kc}Q_{kc} + I_{ks}Q_{ks} = \frac{A^2}{4}\sum \sin(\varphi) \qquad \text{Eq. (21)}$$

It should be noted that in Equations 15-21, the subscript "c" in the terms $I_{kc}$ and $Q_{kc}$ indicates "cosine" terms in some of the equations, and the subscript "s" in $I_{ks}$ and $Q_{ks}$ indicates "sine" terms in some of the equations, as illustrated in FIGS. 5A and 5B.

Figure 6A:
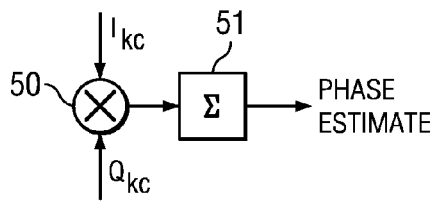
FIG. 6A is a diagram useful in understanding Equations 15-17.
Figure 6B:
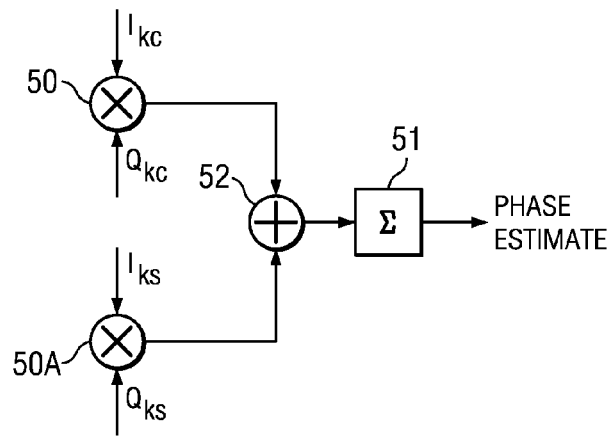
FIG. 6B is a diagram useful in understanding equations 15-21.

FIG. 6A indicates the signal flow digital mixer 50 receiving the in-phase signal $I_{kc}$ of Equation 15 and the quadrature-phase signal $Q_{kc}$ of Equation 16, and also shows the flow of the resulting mixed signal being applied to the input of a digital summer 51. The output of digital summer 51 is used in generating the desired phase mismatch estimate φ. FIG. 6B shows the signal flow of the output of digital mixer 50 shown in FIG. 6A being applied to one input of a digital adder 52. Digital mixer 50A receives the in-phase signal $I_{ks}$ of Equation 18 and the quadrature-phase signal $Q_{ks}$ of Equation 18. FIG. 6B also shows the flow of the resulting mixer output signal being applied to the input of a digital summer 51, the output of which is subsequently used for deriving Equation 26 for the phase mismatch estimate φ.

Equations 18-21 indicate how to eliminate the first term on the right side of Equation 17, which fails to converge to zero under DC conditions, and therefore causes problems in obtaining the phase mismatch estimate φ using the sin(φ) term on the right side of Equation 17. In each mixing and filtering circuit 35, 36, and 37 in filter bank 40 FIG. 5A, the input of a first LPF comes from a corresponding first mixer. A second mixer (not shown) receives an input based on the same NCO but with its phase shifted 90°, and provides an output to a second LPF. The output of the first LPF is designated $I_{0c}$, $I_{1c}$, or $I_{kc}$, etc., and the output of the first LPF is designated $I_{0s}$, $I_{1s}$, or $I_{ks}$, etc.

Thus, there are two signals, generated by the first and second LPFs, respectively, in the in-phase path. The signal generated by the first LPF has a "c" subscript because it is linked to a cosine term in the various equations, and the signal generated by the second LPF has a "s" subscript because it is linked to a sign term in the various equations.

The foregoing description of the in-phase path is equally applicable to the quadrature-phase path, in which the output of the first LPF is designated $Q_{0c}$, $Q_{1c}$, or $Q_{kc}$, etc., and the output of the first LPF is designated $Q_{0s}$, $Q_{1s}$, or $Q_{ks}$, etc.

Equation 21 follows from Equations 18 and 19, does not include any terms that fail to converge to zero during the various summations, and is subsequently used to derive Equations 22-25 in order to obtain the phase mismatch estimate Equation 26 shown below.

$$Q_{ks} = LPF(A\sin(k\omega_c + \omega_m + \varphi)nTs \cdot \sin(k\omega_c nTs + \theta)) \qquad \text{Eq. (22)}$$
$$= \frac{A}{2}\cos(\omega_m nTs + \varphi - \theta);$$

$$Q_{kc} = LPF(A\sin(k\omega_c + \omega_m + \varphi)nTs \cdot \cos(k\omega_c nTs + \theta)) \qquad \text{Eq. (23)}$$
$$= \frac{A}{2}\sin(\omega_m nTs + \varphi - \theta);$$

-continued $$\sum (Q_{ks}^2 + Q_{kc}^2) = \frac{A^2}{4}N; \qquad \text{Eq. (24)}$$

and $$I_{kc}Q_{kc} + I_{ks}Q_{ks} = \frac{A^2}{4}\sum \sin(\varphi) = \frac{A^2}{4}N\sin(\varphi). \qquad \text{Eq. (25)}$$

The desired IQ phase mismatch estimate equation for a particular band therefore is given by $$\sin(\varphi) = \frac{I_{kc}Q_{kc} + I_{ks}Q_{ks}}{Q_{ks}^2 + Q_{kc}^2}. \qquad \text{Eq. (26)}$$

Equation 27 below is a conventional equation for estimation of the gain mismatch Δ between the in-phase and quadrature-phase signals of an IQ signal pair.

$$\sum I_{kc}^2 - Q_{kc}^2 = \sum \frac{A^2}{8}[1 + \cos(2\omega_m nTs - 2\theta)] - \qquad \text{Eq. (27)}$$
$$\sum \frac{A^2(1-\Delta)^2}{8}[1 - \cos(2\omega_m nTs + 2\varphi - 2\theta)] =$$
$$\frac{A^2}{8}\sum 2\Delta + \frac{A^2}{8}\sum \cos(2\omega_m nTs - 2\theta) +$$
$$\sum \frac{A^2(1-\Delta)^2}{8}\cos(2\omega_m nTs + 2\varphi - 2\theta)].$$

The first term on the right side of Equation 27 can be used to determine the gain mismatch Δ for a particular band if the second and third terms converge to zero over the summations except for the case when $\omega_m$ is zero or close to zero. If the second and third terms on the right side of Equation 27 do converge to zero over the summations, then the first term allows convenient determination of the gain mismatch estimate Δ except at frequencies close to DC. Equations 28-34 below indicate how to achieve cancellation of the second and third terms of Equation 27 except under DC conditions. Equation 28 is employed to cause the second and third terms of Equation 27 to converge to zero, to in effect cancel these terms.

$$\sum I_{kc}^2 - Q_{kc}^2 = \sum \frac{A^2}{8}[1 - \cos(2\omega_m nTs - 2\theta)] - \qquad \text{Eq. (28)}$$
$$\sum \frac{A^2(1-\Delta)^2}{8}[1 - \cos(2\omega_m nTs + 2\varphi - 2\theta)] =$$
$$\frac{A^2}{8}\sum 2\Delta - \frac{A^2}{8}\sum \cos(2\omega_m nTs - 2\theta) -$$
$$\sum \frac{A^2(1-\Delta)^2}{8}\cos(2\omega_m nTs + 2\varphi - 2\theta)];$$

-continued $$\sum I_{kc}^2 - Q_{kc}^2 + \sum I_{ks}^2 - Q_{ks}^2 = \qquad \text{Eq. (29)}$$

$$\frac{A^2}{8}\sum 2\Delta + \frac{A^2}{8}\sum \cos(2\omega_m nTs + 2\varphi - 2\theta) +$$

$$\sum \frac{A^2(1-\Delta)^2}{8}\cos(2\omega_m nTs + 2\varphi - 2\theta)] +$$

$$\frac{A^2}{8}\sum 2\Delta - \frac{A^2}{8}\sum \cos(2\omega_m nTs + 2\varphi - 2\theta) -$$

$$\sum \frac{A^2(1-\Delta)^2}{8}\cos(2\omega_m nTs + 2\varphi - 2\theta)] = \frac{A^2}{2}N\Delta,$$

where N is the number of samples added in the summation.

$$Q_{ks} = LPF(A\sin(\omega_c + \omega_m + \varphi)nTs \cdot \sin(k\omega_c nTs + \theta)) \qquad \text{Eq. (30)}$$

$$= \frac{A}{2}\cos(\omega_m nTs + \varphi - \theta);$$

$$Q_{kc} = LPF(A\sin(\omega_c + \omega_m + \varphi)nTs \cdot \cos(k\omega_c nTs + \theta)) \qquad \text{Eq. (31)}$$

$$= \frac{A}{2}\sin(\omega_m nTs + \varphi - \theta);$$

$$\sum (Q_{ks}^2 - Q_{kc}^2) = \frac{A^2}{4}N; \qquad \text{Eq. (32)}$$

and $$\sum I_{ks}^2 - \sum Q_{ks}^2 + \sum I_{kc}^2 - \sum Q_{kc}^2 = \frac{A^2}{2}N\Delta. \qquad \text{Eq. (33)}$$

The desired gain mismatch estimate equation therefore is given by $$2\Delta = \frac{\sum I_{ks}^2 - \sum Q_{ks}^2 + \sum I_{kc}^2 - \sum Q_{kc}^2}{\sum (Q_{ks}^2 + Q_{kc}^2)}. \qquad \text{Eq. (34)}$$

Figure 7:
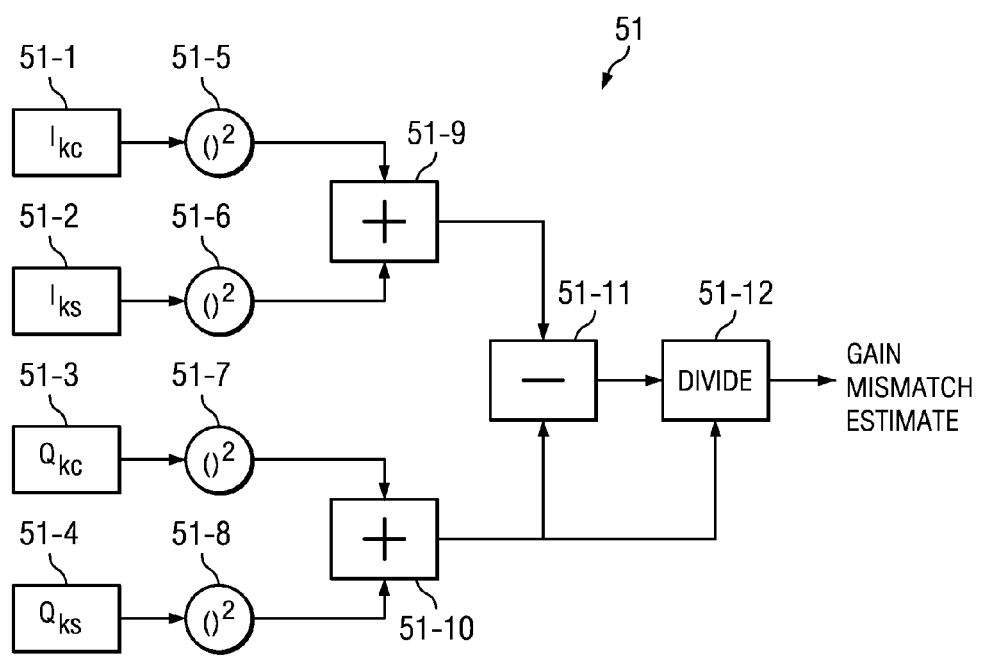
FIG. 7 is a diagram which is helpful in understanding the derivation of Equation 34.

FIG. 7 pictorially indicates how the computation of Equation 34 may be implemented in order to obtain the gain mismatch estimate Δ. The numerator of Equation 34 is the sum of the summation of $I_{ks}^2$ and the summation of $I_{kc}^2$ minus the summation of $Q_{ks}^2$ and the summation of $Q_{kc}^2$. The in-phase component $I_{kc}$ indicated in block 51-1 is squared, as indicated in block 51-5, and $I_{ks}$ in block 51-2 is squared as indicated in block 51-6. The squared terms in blocks 51-5 and 51-6 are summed as indicated in block 51-9. Similarly, the in-phase component $Q_{kc}$ indicated in block 51-3 is squared, as indicated in block 51-7, and $Q_{ks}$ in block 51-4 is squared as indicated in block 51-8. The squared terms in blocks 51-7 and 51-8 are summed as indicated in block 51-10. Block 51-11 then subtracts the sum of $Q_{ks}^2$ and $Q_{kc}^2$ from the sum of $I_{ks}^2$ and $I_{kc}^2$. The result provides the numerator of Equation 34. Block 51-12 divides the numerator by the output of adder 51-10, to provide the denominator of Equation 34. Divider 51-12 divides the numerator of Equation 34 by its denominator to provide the gain mismatch estimate Δ.

It is necessary to determine the filter coefficients $h_i[N]$ and $h_q[N]$ in FIG. 4B As a function of the phase mismatch estimates and the gain mismatch estimates over the frequency range of interest. After the gain mismatch estimate A and the phase mismatch estimate have been determined across the frequency ranges of interest using Equations 26 and 34, the next step is to use them to perform the corresponding corrections needed to eliminate the mismatch/imbalance between the in-phase and quadrature-phase signals of the IQ signal pair over that frequency range. This requires the filter coefficients of the filter coefficient arrays h[N], i.e., $h_i[N]$ and $h_q[N]$, for each of the digital filters 31 and 33 indicated in FIG. 4B to be derived as a function of the foregoing phase mismatch estimates φ and gain mismatch estimates Δ across the frequency range of interest. Each filter coefficient array h[N] may be obtained by performing an inverse fast Fourier transform (IFFT) of the mismatch function frequency response $$H[k]=H_r[k]+jH_i[k],$$

where the real portion is given by $$H_r[k]=1+\cos(\phi)=1+\Delta,$$

and the imaginary portion is given by $$H_i[k]=\sin(\phi).$$

The IFFT of the mismatch function frequency response H[k] provides the filter coefficient array h[N], which may be the same as the filter coefficient array of a FIR filter (finite impulse response filter). The filter coefficients of h[N] are obtained by performing an IFFT of the gain term, i.e., the real portion $H_r[k]$, of the mismatch function frequency response and the phase term, i.e., the imaginary portion $H_i[k]$ of the mismatch function frequency response. The IFFT is performed together on both the gain term and the phase term. The real portion $H_r[k]$ comes directly from the gain mismatch estimates and is equal to 1+Δ, at a particular frequency. The k elements correspond to an array. For example, if 8 frequency bands are to be used, then the values of k will be 0, 1 . . . 7. For k=0, there is one phase mismatch estimate and one gain mismatch estimate, and similarly for each of the other values of k. For H[0], the first element is equal to {gain mismatch estimate at DC}+j {phase mismatch estimate at 0 frequency}. The remaining elements of the filter coefficient array H[0-7] are provided in the same manner, to thereby provide the mismatch function frequency response of the filter.

Then, performing the IFFT of the foregoing array H[k] results in an array h[N], where k=0, 1 . . . 7 represents the 8 frequency bands, and where n is the sample number, k is the variable representing the band of interest, and N is the number of samples for the IFFT. The filter coefficient array h[N] may be "windowed" using a conventional windowing function and then used for correcting the gain and phase mismatches between the in-phase and quadrature-phase portions of the IQ signal pair. The windowing results in the desired array h[N] of filter coefficients for each of filters 31 and 33 in FIG. 4B. (Alternatively, in some cases the filters h[N] may be infinite impulse response (IIR) filters, depending on the particular implementation, in which cases the IFFT coefficients may be used to provide a IIR filter.)

Figure 8:
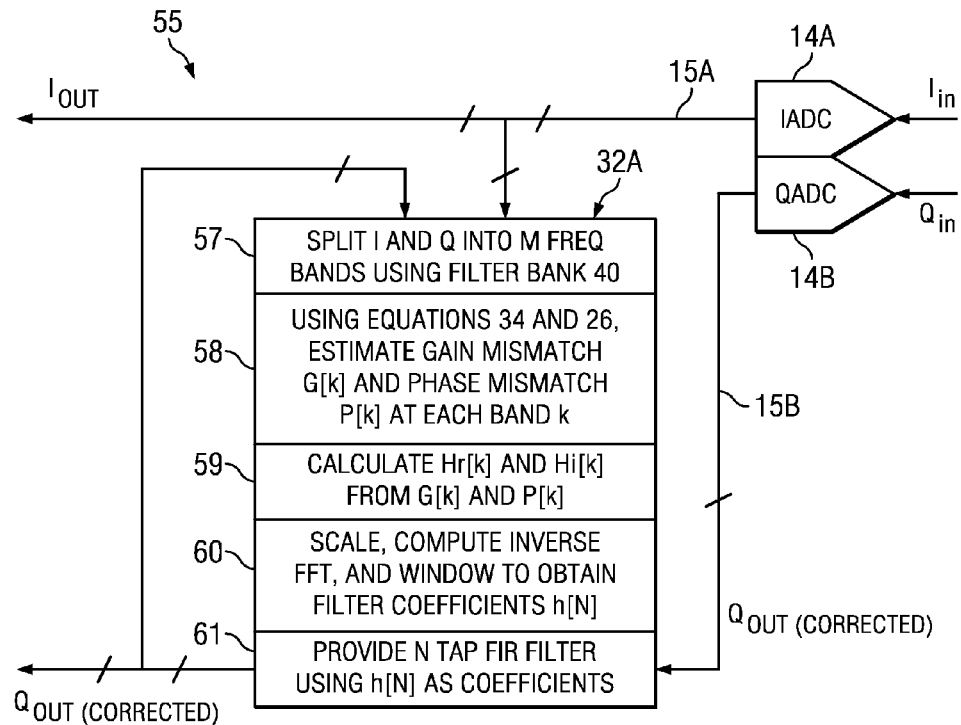
FIG. 8 is a block diagram of a partial implementation of the IQ imbalance estimation and correction algorithm in block 32 of FIG. 4B, excluding a DC phase correction.

Referring to FIG. 8, multi-tap IQ imbalance estimation and correction system 55 includes ADC 14A which digitizes incoming in-phase analog signal $I_{in}$ and also includes ADC 14B which digitizes incoming quadrature-phase analog signal $Q_{in}$. IQ imbalance estimation and correction system 55 also includes a multi-tap IQ imbalance estimation and correction algorithm system 32A (which corresponds generally to block 32 in FIG. 4B). Multi-tap estimation and correction system 32A includes a section 57 which may be utilized to split the digital in-phase and/or quadrature-phase signals into a number N of frequency bands, using filter bank 40 of FIG. 5A.

Multi-tap estimation and correction system 32A in FIG. 8 also includes a section 58 which then uses Equation 34 to estimate the gain mismatches Δ across the previously mentioned frequency range of interest (i.e., for each band k generated in section 57), in order to generate a "gain mismatch array" G[k]. Equation 26 is used in section 58 to estimate the phase mismatches across the same frequency range of interest in order to generate a "phase mismatch array" P[k], for each band k.

Multi-tap estimation and correction system 32A also includes a section 59 which then calculates the above-mentioned real and imaginary coefficient arrays $H_r[k]$ and $H_i[k]$ using the gain mismatch arrays G[k] and the phase mismatch arrays P[k], respectively, that are generated in section 58. Multi-tap estimation and correction system 32A further includes a section 60 that performs conventional scaling operations on $H_r[k]$ and $H_i[k]$ to appropriately scale them, compute the IFFTs, perform a windowing operation, and then compute the IFFTs of the resulting scaled $H_r[k]$ and $H_i[k]$ arrays. The IFFT output is windowed to obtain the filter coefficient arrays h[N] of the in-phase path filter and the quadrature-phase path filter (e.g., filters 31 and 33 in FIG. 4B, which may be considered to be included in section 58 of FIG. 8). The IFFTs provide an N tap FIR filter 61 using the two filter coefficient arrays h[N], where N is the number of mixing and filtering circuits 35, 36, and 37 in filter bank 40 of FIG. 5A.

The digital in-phase signal $I_{OUT}$ generated on bus 15A by ADC 14A is applied to section 57 of multi-tap estimation and correction system 32A. The uncorrected digital quadrature-phase signal $Q_{OUT}$(UNCORRECTED) generated on bus 15B by ADC 14B is applied to an input of N tap filter 61, which effectively eliminates any phase and/or gain mismatch between the digitized representations $I_{OUT}$ and $Q_{OUT}$ (CORRECTED). $Q_{OUT}$(CORRECTED) then is fed back as another input to section 57 of IQ mismatch estimation and correction system 32A, which then computes the gain mismatch estimate Δ and phase mismatch estimate φ of the I path for each of the bands and accordingly determines the filter coefficient arrays h[N]. This "primary" feedback loop from $Q_{OUT}$(CORRECTED) continues operating to ensure that the Q path and the I path are precisely matched. At that point the final value of $Q_{OUT}$(CORRECTED) has been obtained. (Alternatively, the roles of $I_{OUT}$ and $Q_{OUT}$ in FIG. 8 could be reversed to generate a corrected version of $I_{OUT}$ instead of a corrected version of $Q_{OUT}$.)

However, the mismatch correction achieved by system 55 shown in FIG. 8 is not possible at DC. Unfortunately, to obtain values of a real filter coefficient array h[N], the imaginary component $H_i[0]$ of H[0] at DC must be zero. That is, the coefficients of the filter h[N] cannot be imaginary. If the phase mismatch estimate φ is non-zero at DC (i.e., k=0), there will be imaginary components $H_i[k]$ which are not equal to zero, and the filter becomes un-realizable. This constraint prevents N tap IQ imbalance estimation and correction system 32A of FIG. 8 from being able to achieve phase mismatch correction at DC. Consequently, phase mismatch may be present due to various mismatches between the un-shifted mixer input signals and the 90°-shifted mixer input signals generated by the various LOs (local oscillators) in FIG. 5A. This is problematic because IQ phase mismatch can be present at DC from the 90° phase shifter in the LO path in Prior Art FIG. 1. If this is not taken care of, the first band around DC (0-1 MHz in the case shown here) may become unusable.

To correct for such phase mismatch at DC, the conventional phase mismatch correction previously set forth in Equation 12 may be utilized:

$$Q\text{out}(DC\text{corrected}) = (1+\Delta)Q + \beta I. \qquad \text{Eq. (12)}$$

A value of β is chosen so that the phase mismatch estimate φ at DC goes to zero in order to correct the phase mismatch at DC. In this case, $I_{OUT}$ is generated by ADC 14A, and the signal Qout(DC adjusted) is phase corrected at DC. Note that this phase correction/adjustment is independent of frequency. As explained next (with respect to FIG. 9), the conventional phase mismatch correction technique based on Equation 12 may be used along with the IQ mismatch corrections at all frequencies, other than DC, which are obtained using the filter coefficient arrays h[N] as previously explained with reference to FIG. 8.

Figure 9:
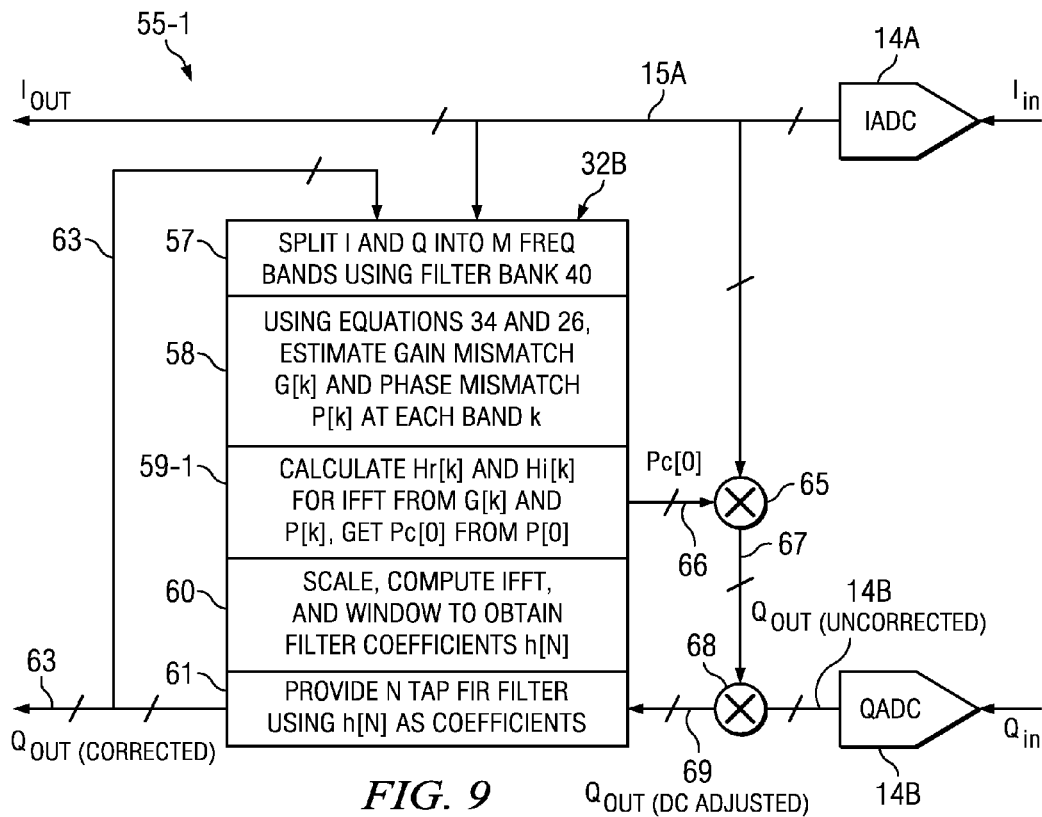
FIG. 9 is a block diagram of a complete implementation of the IQ imbalance estimation and correction algorithm in block 32 of FIG. 4B, including a DC phase correction.

Referring now to FIG. 9, multi-tap IQ imbalance estimation and correction system 55-1 includes ADC 14A which digitizes incoming in-phase analog signal $I_{in}$ and also includes ADC 14B which digitizes incoming quadrature-phase analog signal $Q_{in}$. IQ imbalance estimation and correction system 55-1 also includes a multi-tap IQ imbalance estimation and correction algorithm system 32B. Multi-tap estimation and correction system 32B includes section 57 for splitting the digital in-phase and/or quadrature-phase signals into a number N of frequency bands, using filter bank 40 of FIG. 5A, k being equal to 0, 1 ... N.

As in FIG. 8, multi-tap estimation and correction system 32B in FIG. 9 also includes section 58, which uses Equation 34 to estimate the gain mismatches Δ across the frequency range of interest, except at DC, in order to generate the gain mismatch array G[k]. Equation 26 is used to estimate the phase mismatches across the same frequency range of interest, including DC, in order to generate a phase mismatch array P[k] for each band k.

Multi-tap estimation and correction system 32B also includes a section 59-1 which then calculates the above-mentioned real and imaginary coefficient arrays $H_r[k]$ and $H_i[k]$ using the gain mismatch array G[k] and the phase mismatch array P[k], respectively. Section 59-1 also sets a phase correction array Pc[0] equal to the array P[0] at DC frequency, and provides the single DC value Pc[0] on bus 66 to a subsequently described mixer 65, and thereby establishes a "secondary" feedback loop.

As in FIG. 8, multi-tap estimation and correction system 32B in FIG. 9 also includes section 60 that performs conventional scaling and computing the IFFT of the $H_r[k]$ and $H_i[k]$ arrays and then performs the conventional windowing operation, in order to obtain the needed filter coefficient arrays h[N].

The digital in-phase signal $I_{OUT}$ generated on bus 15A by ADC 14A in FIG. 9 is applied to section 57 of multi-tap estimation and correction system 32B. The uncorrected digital quadrature-phase signal $Q_{OUT}$(UNCORRECTED) generated on bus 15B by ADC 14B is applied to N tap filter 61, which then effectively eliminates any phase and/or gain mismatch between the digitized representations $I_{OUT}$ and $Q_{OUT}$ (CORRECTED) across all frequencies, including DC, of the frequency bands of interest. $Q_{OUT}$(CORRECTED) then is fed back as an input to estimation and correction system 32B, which then estimates the gain mismatch Δ and phase mismatch φ of the I path in each of the bands, and computes the filter coefficients h[N]. The path including $Q_{OUT}$(CORRECTED) and multi-tap IQ imbalance estimation and correction system 32 form a "primary" feedback loop. This primary feedback loop continues operating until it determines that the Q path and the I path are precisely matched, at which point the final value of $Q_{OUT}$ has been determined. (Alternatively, the roles of $I_{OUT}$ and $Q_{OUT}$ in FIG. 8 could be reversed to generate a corrected version of $Q_{OUT}$ instead of a corrected version of $I_{OUT}$.)

For a DC condition, the digital in-phase signal $I_{OUT}$ on bus 15A is applied to section 57 of multi-tap IQ imbalance estimation and correction system 55-1 and also to one input of a digital mixer 65. Section 59-1 in FIG. 9 applies a DC correction array component Pc[0], which is set equal to P[0], to another input of mixer 65 via digital bus 66. The output of mixer 65 is applied via a digital bus 67 to one input of a digital adder 68, the other input of which receives the uncorrected digital quadrature-phase signal $Q_{OUT}$(UNCORRECTED) generated on bus 15B by ADC 14B. The output of adder 68 is applied via digital bus 69 to N tap FIR filter 61, which generates $Q_{OUT}$(CORRECTED) on bus 63 and feeds it back as an input to section 57. The path including section 59-1, bus 66, digital mixer 65, digital adder 68, N tap filter 61, and section 60 of multi-tap IQ imbalance estimation and correction system 32B form the "secondary" feedback loop, the path including N Filter 61, digital bus 63, and section 57 forming a "primary" feedback loop.

The correction array element Pc[0] compensates for the phase mismatch under DC conditions by introducing mismatch at all frequencies through the above-mentioned secondary feedback loop, and compensates for the error introduced into all of the non-zero frequency ranges of interest by the amount of the introduced DC phase mismatch Pc[0]. Since this secondary feedback loop is a nested loop, the time constant of the primary feedback loop must be much slower than the other to ensure system stability.

However, an alternative is to make the primary and secondary feedback loops independent, in which case the error introduced by Pc[0] into the non-zero frequency ranges is a known quantity, and therefore may be subtracted from the mismatch function frequency response H[k], and hence from the estimating equations. This makes the two feedback loops independent so both can run at high speed.

To summarize, the multi-tap IQ mismatch estimation and correction system 55-1 shown in FIG. 9 provides matched in-phase and quadrature-phase signals of an IQ signal pair over any desired frequency range, without requiring a calibration tone. The system may be implemented using a single filter bank and a single N tap filter using h[N] as filter coefficients for frequencies other than zero and a separate technique for correcting mismatches at DC to achieve elimination of mismatches over any entire frequency band of interest. The correction is entirely digital so there is no need to interface with any RF device or ADC to achieve correction of the IQ imbalance. The system and associated algorithm are independent of established radio standards, and allow for integration of the algorithm hardware with the ADCs. Estimates and correction of particular frequency bands can be ignored on the basis of the amount of power in each band. Furthermore, the corrections will hold and not diverge if the power in any band is removed and reapplied.

Although use in conjunction with a zero IF receiver is one of the important applications of the present invention, it should be appreciated that there also are a number of other important applications of the invention, since it can be used for any system that includes I and Q modulation and I and Q demodulation.

It has been recognized that phase mismatches of LO (local oscillator) inputs to mixers and filter delay mismatches both result in significant phase mismatch between the in-phase and quadrature quadrature-phase outputs in an IQ system. The phase mismatch can be corrected by imparting a relative phase correction between the in-phase and quadrature-phase outputs. The errors resulting from the mismatches of the LO signal phase and the mismatches in filter delay may be analyzed separately. Consider that the RF input cosine signal is of frequency $\omega_c+\omega_m$ and is down-converted by the local oscillator of frequency $\omega_c$. The in-phase and quadrature-phase outputs after low pass filtering are given by $$I=\cos(\omega_m n T_s), \text{ and} \qquad \text{Eqn. (35)}$$

$$Q=-\sin(\omega_m n T_s + \phi). \qquad \text{Eqn. (36)}$$

The local oscillator signal in the quadrature-phase path is $$LO_Q = \sin(\omega_c t - \phi), \qquad \text{Eqn. (37)}$$

where $\phi$ is the phase error in the quadrature component of mixing. The estimate of phase error from Equation 37 is $$\sum_N IQ = -\sin(\varphi), \qquad \text{Eqn. (38)}$$

as N tends to ∞. This estimate of $\phi$ is independent of the sign and magnitude of frequency $\omega_m$. Therefore $\Sigma IQ$ gives an estimate of the phase imbalance of the LO signals which is independent of the frequency $\omega_m$.

Figure 1:
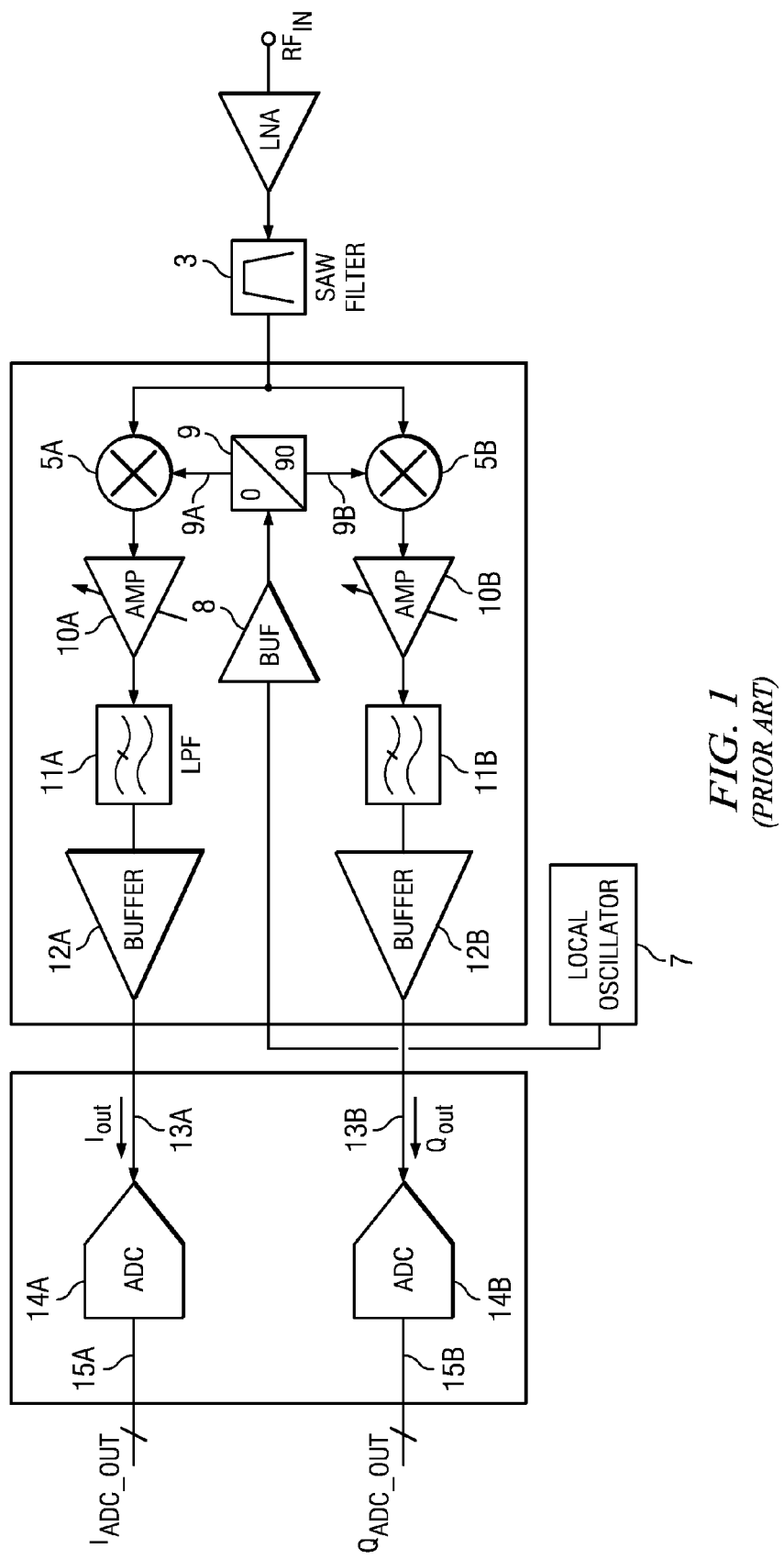
FIG. 1 is a block diagram of conventional zero IF receiver.
Figure 2:
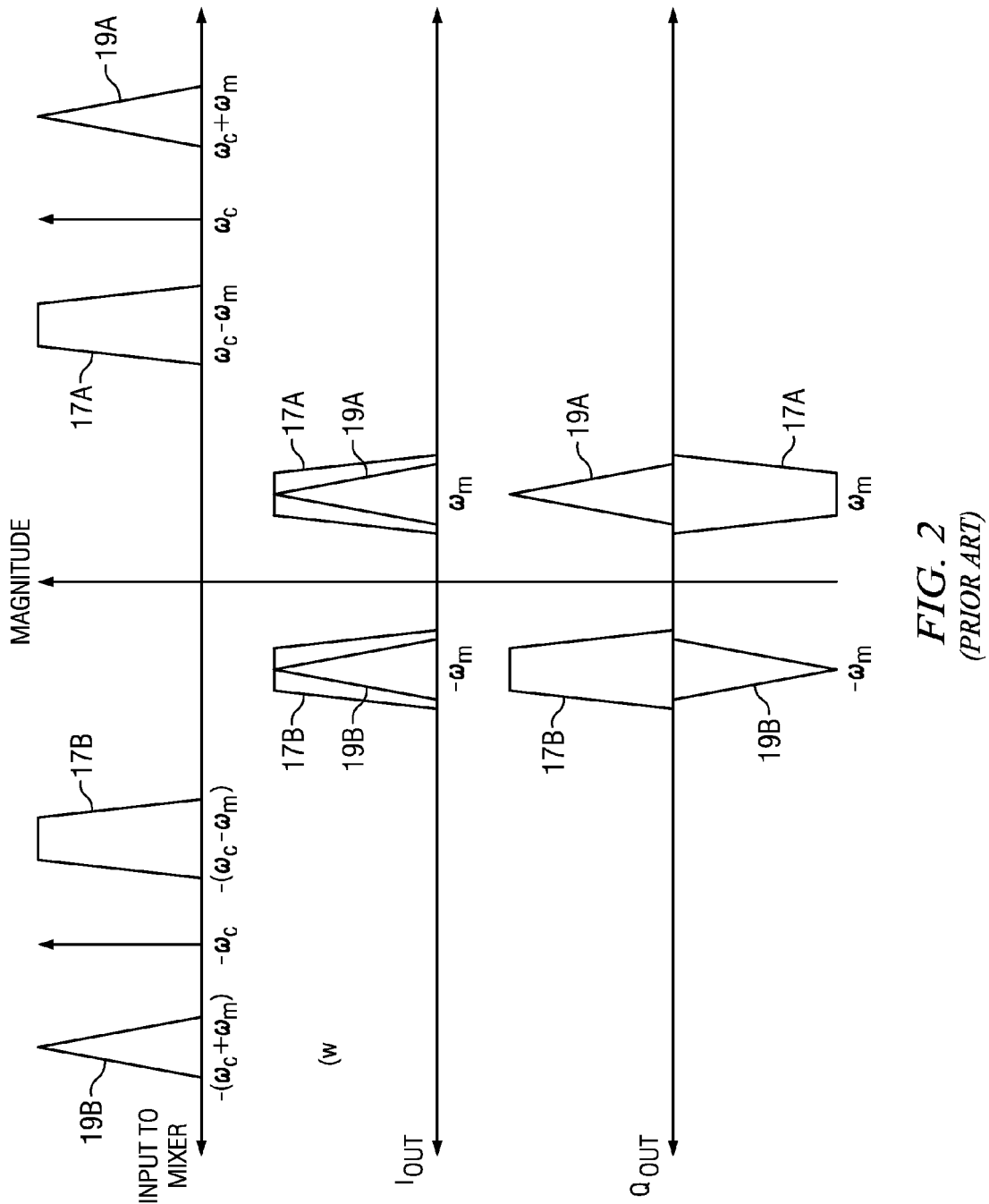
FIG. 2 is a frequency spectrum diagram of the RF input, I path, and Q path signals of the zero if receiver in FIG. 1.
Figure 3:
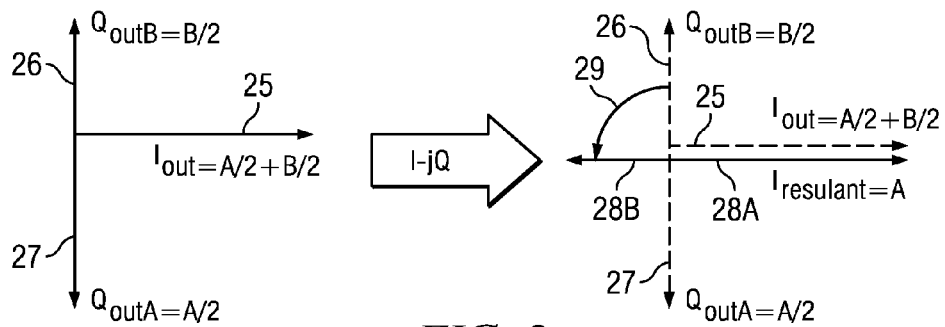
FIG. 3 is a diagram that shows vectors which are useful in explaining operation of the prior art and the present invention.

The mismatches in the filter transfer function of filters 11A and 11B in Prior Art FIG. 1 will be considered next. Ignoring the gain mismatch component, the mismatch in the filter transfer functions can be analyzed as a delay mismatch between the in-phase and quadrature-phase components in a narrow band. In this case (wherein the RF input is a cosine signal of frequency $\phi_c+\phi_m$ and is down-converted by local oscillator with frequency $\phi_c$), $$I=\cos(\omega_m n T_s); \qquad \text{Eqn. (39)}$$

$$Q=-\sin(\omega_m n T_s + \omega_m \Delta T); \qquad \text{Eqn. (40)}$$

where $\Delta T$ is the additional delay in the quadrature path. Applying the estimation equation results in $$\sum_N IQ = \sin(\omega_m \Delta T), \qquad \text{Eqn. (41)}$$

where N goes to ∞.

It should be understood that there is a delay mismatch between the two LPF filters 11A and 11B in Prior Art FIG. 1, and such filter delay mismatch of course ultimately becomes a phase mismatch between the two outputs of the ADCs. There are two components of the phase mismatch. One component is filter delay mismatch due to the difference in the characteristics of LPFs 11A and 11B, and the other component is phase mismatch between the two outputs 9A and 9B of the local oscillator 9. Outputs 9A and 9B of local oscillator 9 are supposed to be exactly 90° out of phase, but mismatch in a phase shifter included in local oscillator 9 may cause output 9A to be slightly more or less than exactly 90° out of phase with respect to output 9B.

Thus, there are two components that cause a net phase mismatch at the outputs of ADCs 14A and 14B and this makes it necessary to distinguish between the two components because the way of correcting the phase mismatch from the local oscillator 9 is quite different from the method of correcting the delay mismatch between LPFs 11A and 11B.

Figure 10A:
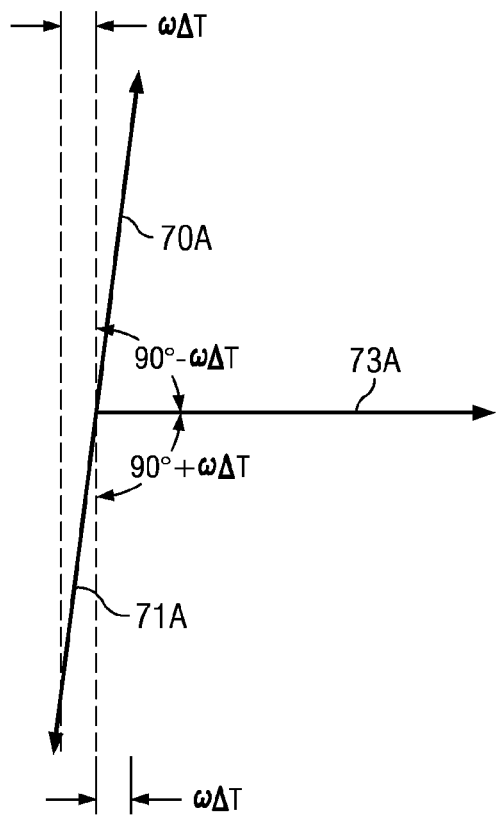
FIGS. 10A and 10B are phasor diagrams are useful in explaining the need for distinguishing mismatches of the mixer signal phases and the filter delay mismatches in an IQ system.

It is evident that the estimate of the transfer function mismatch of the filters, using $\Sigma IQ$, is a function of input frequency $\omega_m$. FIG. 10A shows the in-phase and quadrature-phase components using a phasor diagram. The phasor 73A along the X-axis is the in-phase component I, and also is the reference. The ideal quadrature-phase component Q for positive frequency is indicated by phasor 70A, and is oriented 90° counterclockwise relative to the in-phase component 73A. The ideal quadrature-phase component Q for a negative frequency is indicated by phasor 71A, and is 90° clockwise relative to the in-phase component 73A.

Figure 10B:
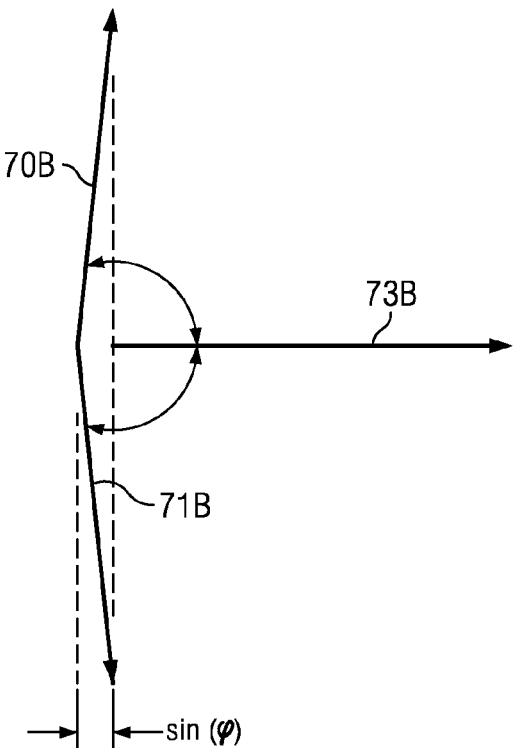

FIG. 10B illustrates the in-phase and quadrature-phase components for a phase mismatch Φ in the LO/mixer signals. The phasor 71B shows the phasor of the quadrature-phase component Q for negative frequency and phasor 70B shows the phasor for positive frequency. The term −ΣIQ represents the projection of the quadrature-phase components 70B and 71B onto the in-phase component 73B and is equal to sin(Φ), and is independent of the sign of the frequency. FIGS. 10A and 10B therefore indicate estimation of phase mismatches due to filter delay and LO phase mismatch, respectively.

Figure 11A:
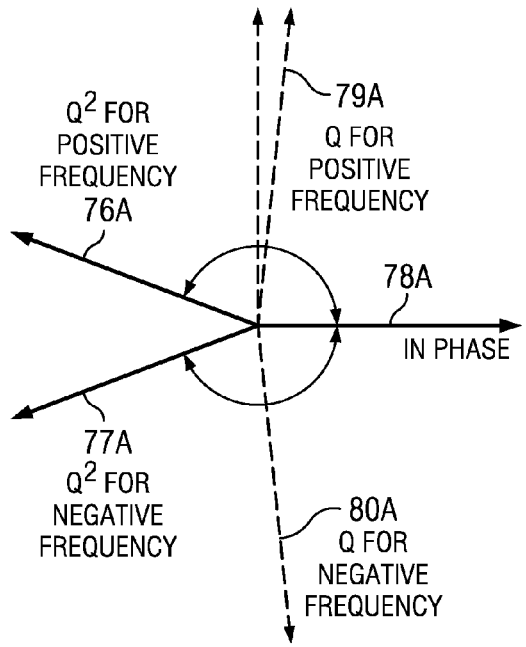
FIGS. 11A and 11B are phasor diagrams which are useful in explaining filter delay mismatch in an IQ system.
Figure 11B:
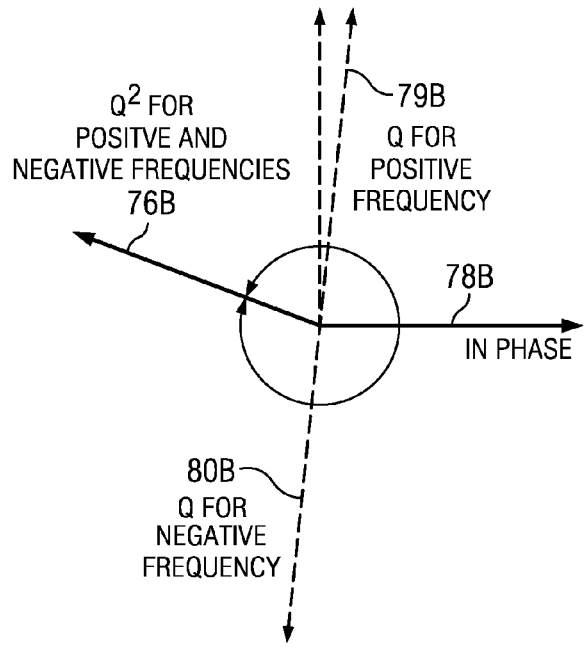

FIGS. 11A and 11B indicate a way of estimating the delay mismatches in the filters using $Q^2$. FIG. 11A shows a phasor diagram for a delay mismatch in the filters. It can be seen that the projection −ΣIQ onto phasor 73A in FIG. 10A depends on the sign of ω in this case. The sign of ω is of particular concern as the sign of the correction needs to change depending on the sign of $\omega_m$. A loop with feedback similar to the cost function ΣIQ determines the direction of corrections based on previous results of ΣIQ would converge. The cost function is an estimate of the error caused by the IQ mismatch. An estimated correction is performed and the cost function is evaluated, and then the next correction is chosen based on whether the cost function increased or decreased. The loop employing the cost function operates so as to minimize the cost function.

One particular case of interest is if the cost function goes to zero independently of the applied correction. When the RF input has $\omega_c+\omega_m1$ and $\omega_c-\omega_m2$ signal components where $\omega_m1$ and $\omega_c+\omega_m2$ fall in the same frequency band and both these signals are of similar magnitude, the estimation would be very close to zero, and this would be incorrect. A method for estimating the timing mismatch error for this case is described below.

Equations 42 and 43 below are based on the IQ signals obtained in Equations 39 and 40, with the amplitude mismatches already corrected by the gain loop, where the gain loop is the real portion of the loop involving the DC component Pc[0] as described with reference to FIG. 9.

$$I^2 = \frac{1+\cos(2\omega_m nT_s)}{2};\qquad\text{Eqn. (42)}$$

$$I^2 = \frac{1-\cos(2\omega_m nT_s + \omega_m \Delta T)}{2}.\qquad\text{Eqn. (43)}$$

The power output of $I^2+Q^2$ for high pass filtering can serve as the cost function for the filter mismatch loop. The sign of the phase estimate of the original loop is a function of the sign of the frequency ω in presence of filter delay mismatch, and as filtering progresses, a new loop evolves that estimates the filter delay mismatch independently of the sign of the input frequency. The high pass filtering is required to remove the DC component in the above equations. It can be shown that the high pass filtering can be avoided by employing the cost function indicated by Equation 44.

$$\text{CostFunction}=(I_c^2-I_s^2)-(Q_c^2-Q_s^2).\qquad\text{Eqn. (44)}$$

Estimation of the amplitude and phase mismatches between the in-phase and quadrature-phase paths can be estimated using DFTs (discrete Fourier transforms) and/or FFTs. A DFT operating on N points sampled uniformly at clock frequency Fs has a "bin resolution" of Fs/2N Hz. The need for the previously described filter bank 40 can be avoided, because a FFT computes the amplitude (which may represent the gain) and phase of the in-phase and quadrature-phase signals in each band of bandwidth Fs/2N. A large value of N reduces the noise in the estimates of the mismatches but increases the hardware complexity. N is chosen such that in a bandwidth of Fs/2N, the amplitude mismatches (and hence the gain mismatches) of the in-phase and quadrature-phase signals are sufficiently constant that the residual mismatch error after correction remains within an acceptable limit in the bandwidth. Equations 45-50 show the computation of the gain mismatches and phase mismatches using DFTs. (Note that DFTs and FFTs provide the same results, although they are implemented differently.)

$$\text{Xi\_real}(k) = \sum_{n=0}^{N-1} I(n)\cos\left(\frac{2\pi nk}{N}\right);\qquad\text{Eqn. (45)}$$

$$\text{Xi\_imag}(k) = \sum_{n=0}^{N-1} I(n)\sin\left(\frac{2\pi nk}{N}\right);\qquad\text{Eqn. (46)}$$

$$\text{Xq\_real}(k) = \sum_{n=0}^{N-1} Q(n)\cos\left(\frac{2\pi nk}{N}\right);\qquad\text{Eqn. (47)}$$

$$\text{Xq\_imag}(k) = \sum_{n=0}^{N-1} Q(n)\sin\left(\frac{2\pi nk}{N}\right);\qquad\text{Eqn. (48)}$$

$$\text{GainMismatch} == \qquad\text{Eqn. (49)}$$

$$\frac{\sqrt{E(\text{Xi\_real}^2 + \text{Xi\_imag}^2 - \text{Xq\_real}^2 + \text{Xq\_imag}^2)}}{\sqrt{E(\text{Xi\_real}^2 + \text{Xi\_imag}^2)}};$$

and $$\text{PhaseMismatch} == E(\text{Iphase} - \text{Qphase} - 90\ deg) =\qquad\text{Eqn. (50)}$$

$$E\left(\tan^{-1}\left(\frac{\text{Xi\_imag}}{\text{Xi\_real}}\right)\right) - E\left(\tan^{-1}\left(\frac{\text{Xq\_imag}}{\text{Xq\_real}}\right)\right).$$

Note that the term "GainMismatch" in Equation 49 corresponds to Δ and the term "PhaseMismatch" in Equation 50 corresponds to φ as in earlier equations. By way of definition, the term "phase mismatch" as used herein may also be used to refer to filter delay mismatches as well as to mismatches in corresponding absolute phase values. The term "E" in equations 45-50 refers to an "expectation function", which is a mathematical way of referring to average or mean value. The term "X" represents a frequency domain representation. Xi_real corresponds to the results of performing a FFT to convert time domain data to frequency domain data. (Performing an inverse FFT (IFFT) is performed on frequency domain data and to convert it to time domain data.)

It is important to note that the phase mismatch φ has to be computed as the average of multiple FFT outputs, ie., as E(Iphase-Qphase-90deg) and not as E(Iphase)-E(Qphase)-90deg, because E(Iphase) and E(Qphase) tend to zero. The same necessity for separating the mismatch components into the LO and filter delay components also applies to the FFT-based approach as well to the DFT-based approach. Similarly, it can be shown that a FFT operating on $I^2$ and $Q^2$ can be used to obtain the filter mismatch component of the error.

Use of an inverse FFT can convert the frequency domain phase and gain mismatch information to an array h[N] of filter coefficients that result in a time domain impulse response of the correction filter, for example as in filter 61 in FIG. 9. A rectangular window has a sync response in the frequency domain, resulting in a null at the edge of the filter pass-band, which is undesirable. A suitable window, such as a Hamming window, is applied to the array h(n) obtained by performing the IFFT. The IFFT used is of the standard form $$h(n) = \frac{\sum_{k=0}^{N-1} X(k)e^{\frac{jkn}{N}}}{N}, \quad \text{Eqn. (51)}$$

where h(n) represents the array h[N] previously described. The foregoing filter also may be a standard FIR filter of the form $$y(n) = \sum_{k=0}^{N-1} x(n-k)h(k). \quad \text{Eqn. (52)}$$

The process of distinguishing between phase mismatch at the outputs of local oscillator 9 and filter delay mismatch in filters 11A and 11B of FIG. 1 actually is somewhat masked by the development of equations 35-50, because of the cost function that is used to minimize the error. The cost function simultaneously takes into account both the delay mismatch in LPF's 11A and 11B and the phase mismatch in local oscillator 9 of FIG. 1.

$$RF_{IN} = A\cos[(\omega_c + \omega_{m1})t] + A\cos[(\omega_c + \omega_{m2})t] \quad \text{Eqn. (53)}$$

$$I_{out}(t) = LPF\{RF_{IN}\cos(\omega_c)t\} \quad \text{Eqn. (54)}$$

$$= \frac{A}{2}\cos(\omega_{m1}t) + \frac{B}{2}\cos(\omega_{m2}t)$$

$$I_{ADC\_OUT}(n) = \frac{A}{2}\cos(\omega_{m1}nT) + \frac{B}{2}\cos(\omega_{m2}nT) \quad \text{Eqn. (55)}$$

$$Q_{out}(t) = -LPF\{RF_{IN}\sin(\omega_c t + \varphi\} \quad \text{Eqn. (56)}$$

$$= \frac{A}{2}\sin(\omega_{m1}t - \varphi + \omega_{m1}\Delta T) -$$

$$\frac{B}{2}\sin(\omega_{m2}t + \varphi + \omega_{m2}\Delta T)$$

$$Q_{ADC\_OUT}(n) = \frac{A}{2}\sin(\omega_{m1}nT - \varphi + \omega_{m1}\Delta T) - \quad \text{Eqn. (57)}$$

$$\frac{B}{2}\sin(\omega_{m2}nT + \varphi + \omega_{m2}\Delta T)$$

$$I_{kc} = I_{ADC}(n)\cos(\omega_{mk}nT) \quad \text{Eqn. (58)}$$
$$I_{ks} = I_{ADC}(n)\sin(\omega_{mk}nT)$$
$$Q_{kc} = Q_{ADC}(n)\cos(\omega_{mk}nT)$$
$$Q_{ks} = Q_{ADC}(n)\sin(\omega_{mk}nT)$$

$$P1 = BPF\{I_{kc} + Q_{ks}\} \quad \text{Eqn. (59)}$$

$$= BPF\left\{\left[\frac{A}{2}\cos(\omega_{m1}nT) + \frac{B}{2}\cos(\omega_{m2}nT)\right]\cos(\omega_k nT) + \right.$$

$$\left[\frac{A}{2}\sin(\omega_{m1}nT - \varphi + \omega_{m1}\Delta T) - \right.$$

$$\left.\frac{B}{2}\sin(\omega_{m2}nT + \varphi + \omega_{m2}\Delta T)\right]\sin(\omega_k nT)\right\}$$

$$= BPF\left\{\frac{A}{2}\cos(\omega_{m1}nT)\cos(\omega_k nT) + \right.$$

$$\frac{A}{2}\sin(\omega_{m1}nT)\sin(\omega_k nT) -$$

$$\frac{A}{2}\sin(\varphi - \omega_{m1}\Delta T)\cos(\omega_{m1}nT)\sin(\omega_k nT) +$$

$$\frac{B}{2}\cos(\omega_{m1}nT)\cos(\omega_k nT) -$$

$$\frac{B}{2}\sin(\omega_{m2}nT)\sin(\omega_k nT) -$$

$$\left.\frac{B}{2}\sin(\varphi + \omega_{m2}\Delta T)\cos(\omega_{m2}nT)\cos(\omega_k nT)\right\}.$$

Filtering with a bandpass filter centered at $\omega_k$ and ignoring the mismatch component of A results in $$P1 = \frac{A}{2}\cos[(\omega_{m1} - \omega_k)nTs] + \quad \text{Eqn. (60)}$$

$$\frac{B}{4}\sin(\varphi + \omega_{m2}\Delta T)\sin[(\omega_{m2} - \omega_k)nTs].$$

Similarly, $$P2 = BPF\{I_{ks} + Q_{kc}\}, \text{ similarly leading to} \quad \text{Eqn. (61)}$$

$$P2 = -\frac{A}{4}\sin(\varphi - \omega_{m1}\Delta T)\cos[(\omega_{m1} - \omega_k)nTs] -$$

$$\frac{B}{2}\cos[(\omega_{m2} - \omega_k)nTs]$$

$$\frac{\sum P1 * P2}{N} = -\frac{A^2}{16}\sin(\varphi - \omega_{m1}\Delta T) - \frac{B^2}{16}\sin(\varphi + \omega_{m2}\Delta T). \quad \text{Eqn. (62)}$$

Approximating sin(x)=x for small values of x results in $$\frac{\sum P1 * P2}{N} = -\varphi\left\{\frac{\sum A^2 + \sum B^2}{16}\right\} + \Delta T \quad \text{Eqn. (63)}$$

$$\left\{\frac{\omega_{m1}\sum A^2 - \omega_{m1}\sum B^2}{16}\right\}$$

$$P3^3 = \left[\frac{A}{2}\cos\right. \quad \text{Eqn. (64)}$$

$$\left\{(\omega_{m1} - \omega_k nTs) + \frac{B}{4}\sin(\varphi + \omega_{m2}\Delta T)\sin\{(\omega_{m2} - \omega_k)nTs\}\right]^3 =$$

$$\frac{A^3}{8}\cos^3\{(\omega_{m1} - \omega_k)nTs\} + \frac{3A^3B}{16}\sin(\varphi + \omega_{m2}\Delta T)$$

$$\cos^2\{(\omega_{m1} - \omega_k)nTs\}\sin\{(\omega_{m2} - \omega_k)nTs\} +$$

$$\frac{3AB^2}{32}\sin^2(\varphi + \omega_{m2}\Delta T)\cos\{(\omega_{m1} - \omega_k)nTs\}$$

$$\sin^2\{(\omega_{m2} - \omega_k)nTs\} +$$

$$\frac{B^3}{64}\sin^3(\varphi + \omega_{m2}\Delta T)\sin^3\{(\omega_{m2} - \omega_k)nTs\}$$

$$\sum P1^3P2 = \quad \text{Eqn. (65)}$$

$$-\sin(\varphi - \omega_{m1}\Delta T)\frac{3\sum A^3}{256} - \sin(\varphi + \omega_{m2}\Delta T)\frac{3\sum A^2B^2}{64}$$

$$\sum P1^3P2 = -\varphi\left\{\frac{3\sum A^4}{256} + \frac{3\sum A^2B^2}{64}\right\} - \quad \text{Eqn. (66)}$$

$$\Delta T\left\{\frac{3\omega_{m2}\sum A^2B^2}{64} - \frac{3\omega_{m1}\sum A^4}{256}\right\}.$$

Squaring and accumulating terms in Equations 58 and 59 results in $$\sum P1^4 = \frac{\sum A^4}{32} \quad \text{Eqn. (67)}$$

$$\sum P2^4 = \frac{\sum B^4}{32} \quad \text{Eqn. (68)}$$

$$\sum P1^2P1^2 = \frac{\sum A^2B^2}{128}. \quad \text{Eqn. (69)}$$

Using equations 67, 68 and 69, equations 63 and 64 can be solved for $\phi$ and $\Delta T$.

An additional advantage in this scheme of correcting the mismatch is that the correction at a frequency can be gated by the power spectrum at the frequency. If the power at a frequency band is observed to be less than a predetermined threshold, we can choose not to adapt the filter coefficients for that band.

This scheme need not be limited to background estimation and correction, but can be used as one time calibration where the mismatches of a device are determined once and the coefficients are trimmed to remove the mismatch. The algorithm can be adapted as a partial background and partial one-time trim. For example, the group delay mismatch can be made a one-time calibration and the phase mismatch can be used repeatedly in a background correction algorithm.

In some cases it may be most beneficial to split the I and Q signals into multiple bands using a phase splitter, and then, separate out the phase mismatch and the filter delay mismatch in each band. In other cases it may not be necessary to perform the distinguishing of filter delay mismatch and mixer input signal phase mismatch.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A system for correcting gain imbalance and phase imbalance between first and second signals which are 90° out of phase, the system comprising:
   (a) circuitry for estimating a phase mismatch and gain mismatch between the first signal and the second signal at a plurality of frequency bands;
   (b) circuitry for performing an inverse fast Fourier transform (IFFT) on each of a number of arrays of the phase mismatch estimates and the gain mismatch estimates to generate correction filter coefficients for a N tap correction filter, N is a positive non-zero integer; and
   (c) wherein the N tap correction filter filters an uncorrected value of the second signal to generate a corrected value of the second signal,
   (d) circuitry for splitting each of the first and second signals into a predetermined number of frequency bands to provide a plurality of in-phase and quadrature-phase signals in the frequency bands, respectively, and
   (e) the circuitry for estimating comprising circuitry for successively producing a phase mismatch estimate and a gain mismatch estimate corresponding to successive frequency bands, respectively, on the basis of samples of the in-phase and quadrature-phase signals in the frequency bands,
   wherein the splitting circuitry includes
   a bank of filters for splitting each of the first and second signals into the predetermined number of frequency bands, and
   wherein the estimating circuitry operates to successively produce a plurality of pairs of mismatch estimates corresponding to the plurality of successive frequency bands, respectively, on the basis of samples of in-phase and quadrature-phase signal values generated by the bank of filters, each pair including a phase mismatch estimate and a gain mismatch estimate, and
   circuit for DC offset correction including a DC phase correction circuit including a mixer for mixing the first signal with a DC mismatch adjustment value and an adder for adding an output of the mixer to the second signal to generate the uncorrected value of the second signal such that the N tap filter essentially eliminates the gain imbalance and the phase imbalance between the first and second signals across all of the frequency bands.

2. The system of claim 1 wherein the estimating circuitry performs a function of distinguishing filter delay mismatches and mixer phase mismatches of the first signal and the second signal at the plurality of frequency bands.

3. The system of claim 1 wherein the phase mismatch estimates are determined in accordance with the equation $$\sin(\varphi) = \frac{I_{kc}Q_{kc} + I_{ks}Q_{ks}}{Q_{ks}^2 + Q_{kc}^2},$$

where $\phi$ is a phase mismatch estimate, $I_{kc}$ is a cosine-related in-phase signal in a predetermined frequency band produced by the bank of filters, $Q_{kc}$ is a cosine-related quadrature signal in the predetermined frequency band produced by the bank of filters, $I_{ks}$ is a sine-related in-phase signal in a predetermined frequency band produced by the bank of filters, and $Q_{ks}$ is a sine-related quadrature signal in the predetermined frequency band produced by the bank of filters.

4. The system of claim 1 wherein the gain mismatch estimates are determined in accordance with equation $$2\Delta = \frac{\sum I_{ks}^2 - \sum Q_{ks}^2 + \sum I_{kc}^2 - \sum Q_{kc}^2}{\sum (Q_{ks}^2 + Q_{kc}^2)},$$

where $\Delta$ is a gain mismatch estimate, $I_{kc}$ is a cosine-related in-phase signal in a predetermined frequency band produced by the bank of filters, $Q_{kc}$ is a cosine-related quadrature signal in the predetermined frequency band produced by the bank of filters, $I_{ks}$ is a sine-related in-phase signal in the predetermined frequency band produced by the bank of filters, and $Q_{ks}$ is a sine-related quadrature signal in the predetermined frequency band produced by the bank of filters.

5. The system of claim 1 wherein the N tap filter includes a finite impulse response filter (FIR).

6. The system of claim 1 wherein the number of arrays of the phase mismatch estimates and gain mismatch estimates represent a mismatch estimate frequency response of an In-phase and Quandrature (IQ) system through which the first and second signals pass.

7. The system of claim 1 wherein the bank of filters includes a plurality of mixing and filtering circuits for mixing the first signal with a plurality of first reference signals and for mixing the second signal with a plurality of second reference signals which are shifted 90° relative to a corresponding first reference signal, respectively, and also includes low pass filtering outputs of the various mixed signals to provide the samples of the in-phase and quadrature-phase signal values generated by the bank of filters.

8. The system of claim 1 wherein the number of arrays are included in a primary feedback loop also including the bank of filters, the estimating circuitry, and the inverse fast Fourier transform performing circuitry, and wherein the DC mismatch adjustment value is provided as an input to a secondary feedback loop including the mixer for mixing the first signal with the DC mismatch adjustment value and the adder to generate the uncorrected value of the second signal.

9. The system of claim 8 wherein the primary and secondary feedback loops are independent.

10. The system of claim 1 wherein the first signal is produced by a first analog to digital converter in response to an in-phase analog signal, and the second signal is produced by a second analog to digital converter in response to quadrature-phase analog signal.

11. The system of claim 1 wherein the first signal is an in-phase signal and the second signal is a quadrature-phase signal.

12. A method for correcting gain imbalance and phase imbalance between first and second signals which are 90° out of phase, the method comprising:
   (a) estimating a phase mismatch and gain mismatch between the first signal and the second signal in a plurality of frequency bands;
   (b) performing an inverse fast Fourier transform (IFFT) on each of a number of arrays of the phase mismatch estimates and the gain mismatch estimates to generate filter coefficients for an N tap correction filter, N is a positive non-zero integer; and
   (c) filtering an uncorrected value of the second signal by means of the N tap correction filter to generate a corrected value of the second signal,
   (d) splitting each of the first and signals into a predetermined number of frequency bands to provide a plurality of in-phase and quadrature-phase signals in the frequency bands, respectively, and successively producing a phase mismatch estimate and a gain mismatch estimate corresponding to successive frequency bands, respectively, on the basis of samples of the in-phase and quadrature-phase signals in the frequency bands; and
   (e) generating a DC mismatch adjustment value on the basis of a phase mismatch estimate at zero frequency, mixing the first signal with the DC mismatch adjustment value using a mixer and adding an output of the mixer to the second signal to generate the uncorrected value of the second signal such that the N tap filter essentially eliminates the gain imbalance and the phase imbalance between the first and second signals at DC and across all of the frequency bands.

13. The method of claim 12 including distinguishing filter delay mismatch components and mixer phase input mismatch components of the first signal and the second signal in the multiple bands of frequencies and using the filter delay mismatch components and mixer phase input mismatch components separately to correct them, respectively.

14. The method of claim 12 including determining the phase mismatch estimates in accordance with the equation $$\sin(\varphi) = \frac{I_{kc}Q_{kc} + I_{ks}Q_{ks}}{Q_{ks}^2 + Q_{kc}^2},$$

and determining the gain mismatch estimates in accordance with equation $$2\Delta = \frac{\sum I_{ks}^2 - \sum Q_{ks}^2 + \sum I_{kc}^2 - \sum Q_{kc}^2}{\sum(Q_{ks}^2 + Q_{kc}^2)},$$

where $\Delta$ is a phase mismatch estimate, $\phi$ is a gain mismatch estimate, $I_{kc}$ is a cosine-related in-phase signal in a predetermined frequency band, $Q_{kc}$ is a cosine-related quadrature signal in the predetermined frequency band, $I_{ks}$ is a sine-related in-phase signal in the predetermined frequency band, and $Q_{ks}$ is a sine-related quadrature signal in the predetermined frequency band.

15. The method of claim 12 wherein the estimating includes computing the gain mismatch and the phase mismatch using discrete Fourier transforms in accordance with the equations $$Xi\_real(k) = \sum_{n=0}^{N-1} I(n)\cos\left(\frac{2\pi nk}{N}\right),$$

$$Xi\_imag(k) = \sum_{n=0}^{N-1} I(n)\sin\left(\frac{2\pi nk}{N}\right),$$

$$Xq\_real(k) = \sum_{n=0}^{N-1} Q(n)\cos\left(\frac{2\pi nk}{N}\right),$$

$$Xq\_imag(k) = \sum_{n=0}^{N-1} Q(n)\sin\left(\frac{2\pi nk}{N}\right),$$

$$GainMismatch = \frac{\sqrt{E(Xi\_real^2 + Xi\_imag^2 - Xq\_real^2 + Xq\_imag^2)}}{\sqrt{E(Xi\_real^2 + Xi\_imag^2)}},$$

and $$PhaseMismatch = E(Iphase - Qphase - 90\ deg) = E\left(\tan^{-1}\left(\frac{Xi\_imag}{Xi\_real}\right)\right) - E\left(\tan^{-1}\left(\frac{Xq\_imag}{Xq\_real}\right)\right),$$

where E represents an averaging operation, k varies from 0 to N, N represents the number of points in an IFFT, and n represents the sample number.

16. A system for correcting gain imbalance and phase imbalance between first and second signals which are 90° out of phase, comprising:
   (a) means for estimating a phase mismatch and gain mismatch between the first signal and the second signal in a plurality of frequency bands;
   (b) means for performing an inverse fast Fourier transform (IFFT) on each of a number of arrays of the phase mismatch estimates and the gain mismatch estimates to generate filter coefficients for an N tap correction filter, N is a positive non-zero integer; and
   (c) wherein the N tap correction filter filters an uncorrected value of the second signal to generate a corrected value of the second signal,
   (d) circuitry for splitting each of the first and second signals into a predetermined number of frequency bands to provide a plurality of in-phase and quadrature-phase signals in the frequency bands, respectively, and
   (e) the means for estimating comprises circuitry for successively producing a phase mismatch estimate and a gain mismatch estimate corresponding to successive frequency bands, respectively, on the basis of samples of the in-phase and quadrature-phase signals in the frequency bands,
   wherein the splitting circuitry includes
   a bank of filters for splitting each of the first and second signals into the predetermined number of frequency bands, and wherein the estimating circuitry operates to successively produce a plurality of pairs of mismatch estimates corresponding to the plurality of successive frequency bands, respectively, on the basis of samples of in-phase and quadrature-phase signal values generated by the bank of filters, each pair including a phase mismatch estimate and a gain mismatch estimate, and circuit for DC phase correction including a DC phase correction circuit including a mixer for mixing the first signal with a DC mismatch adjustment value and an adder for adding an output of the mixer to the second signal to generate the uncorrected value of the second signal such that the N tap filter essentially eliminates the gain imbalance and the phase imbalance between the first and second signals across all of the frequency bands.

17. The system of claim 16 including means for distinguishing filter delay mismatch components and mixer phase mismatch components of the first signal and the second signal in the multiple bands of frequencies.

* * * * *